(12) United States Patent
Mishra et al.

(10) Patent No.: US 8,431,680 B2
(45) Date of Patent: Apr. 30, 2013

(54) SEMICONDUCTOR MATERIALS BASED ON THIENOTHIOPHENE-2,5-DIONE OLIGOMERS AND POLYMERS

(75) Inventors: Ashok Kumar Mishra, Singapore (SG); Subramanian Vaidyanathan, Basel (CH); Hiroyoshi Noguchi, Singapore (SG); Florian Doetz, Singapore (SG); Bo Zhu, Shanghai (CN)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 13/454,429

(22) Filed: Apr. 24, 2012

(65) Prior Publication Data

US 2012/0296058 A1 Nov. 22, 2012

Related U.S. Application Data

(60) Provisional application No. 61/479,856, filed on Apr. 28, 2011.

(51) Int. Cl.
*C08G 75/00* (2006.01)
(52) U.S. Cl.
USPC ............ 528/380; 528/377; 528/378; 528/373

(58) Field of Classification Search .................. 528/380, 528/377, 378, 373
See application file for complete search history.

(56) References Cited

FOREIGN PATENT DOCUMENTS

DE 39 17 323 A1 11/1990
JP 4-338761 11/1992

*Primary Examiner* — Shane Fang
(74) *Attorney, Agent, or Firm* — Oblon, Spivak, McClelland, Maier & Neustadt, L.L.P.

(57) ABSTRACT

The present invention provides a polymer comprising a unit of formula

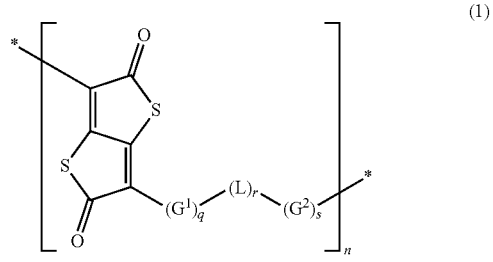

(1)

and an electronic device comprising the polymer as semiconducting material.

14 Claims, No Drawings

SEMICONDUCTOR MATERIALS BASED ON THIENOTHIOPHENE-2,5-DIONE OLIGOMERS AND POLYMERS

Organic semiconducting materials can be used in electronic devices such as organic photo-voltaic devices (OPVs), organic field-effect transistors (OFETs), organic light emitting diodes (OLEDs), and organic electrochromic devices (ECDs).

For efficient and long lasting performance, it is desirable that the organic semiconducting material-based devices show high charge carrier mobility as well as high stability, in particular towards oxidation by air, under ambient environmental conditions.

Furthermore, it is desirable that the organic semiconducting materials are compatible with liquid processing techniques such as spin coating as liquid processing techniques are convenient from the point of processability, and thus allow the production of low cost organic semiconducting material-based electronic devices. In addition, liquid processing techniques are also compatible with plastic substrates, and thus allow the production of light weight and mechanically flexible organic semiconducting material-based electronic devices.

The use of polymeric organic semiconducting materials in electronic devices is known in the art.

Bao, Z.; Dobadalapur, A.; Lovinger, A. J. *Appl. Phys. Lett.* 1996, 69, 4108-4110 describes the use of regioregular poly (3-hexylthiophene) in field-effect transistors.

Zhang, M.; Tsao, H. N.; Pisula, W.; Yang, C.; Mishra, A. K.; Müllen, K. *J. Am. Chem. Soc.* 2007, 129, 3472-3473 describes polymers of formula

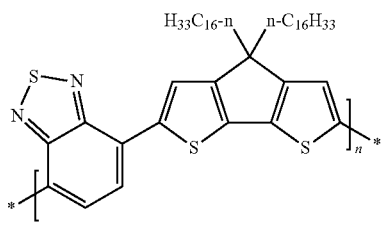

for use in organic field effect transistors (OFETs).

Ong, B. S.; Wu, Y.; Liu, P.; Gardner, S. *J. Am. Chem. Soc.* 2004, 126, 3378-3379 describes polymers of formula

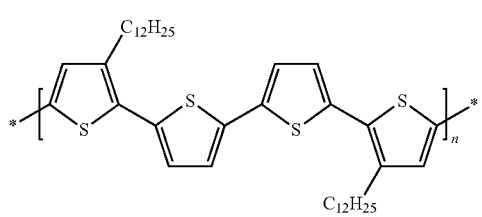

for use in organic field effect transistors (OFETs).

Zou, Y.; Najari, A.; Berrouard, P.; Beaupre, S.; Badrou, R. A.; Tao, Y.; Leclerc, M. *J. Am. Chem. Soc.* 2010, 132, 5330-5331 describes polymers of formula

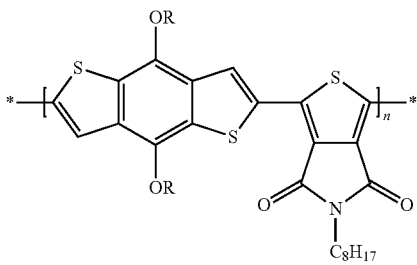

R = 2EH as donor materials for use in photovoltaic devices.

McCulloch, I.; Heeney, M.; Bailey, C.; Genevicius, K.; MacDonald, I.; Shkunov, M.; Sparrowe, D.; Tierney, S.; Wagner, R.; Zhang, W.; Chabinyc, M. L.; Kline, R. J.; McGehee, M. D.; Toney, M. F. *Nat. Mater.* 2006, 5(4), 328-333 describes polymers of formula

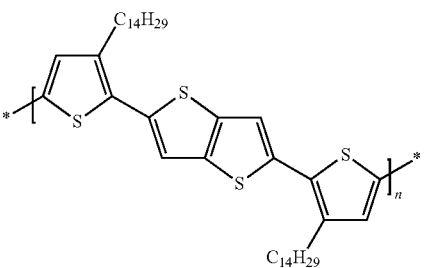

for use in organic field effect transistors (OFETs).

L. Bürgi, M. Turbiez, R. Pfeiffer, F. Bienewald, H.-J. Kirner, C. Winnewisser, *Adv. Mater.* 2008, 20, 2217-2224 describes polymers of formula

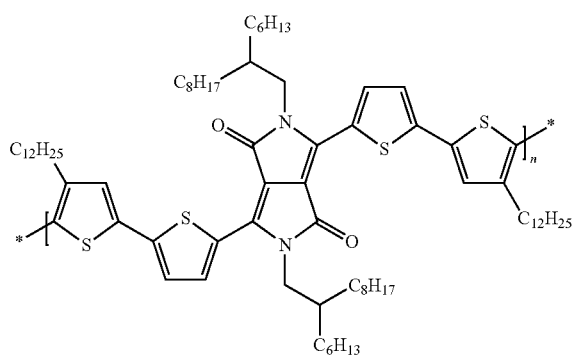

for use in organic field effect transistors (OFETs).

J. C. Bijleveld, A. P. Zoombelt, S. G. J. Mathijssen, M. M. Wienk, M. Turbiez, D. M. de Leeuw, R. A. J. Janssen, *J. Am. Chem. Soc.* 2009, 131, 16616-16617 describes polymers of formula

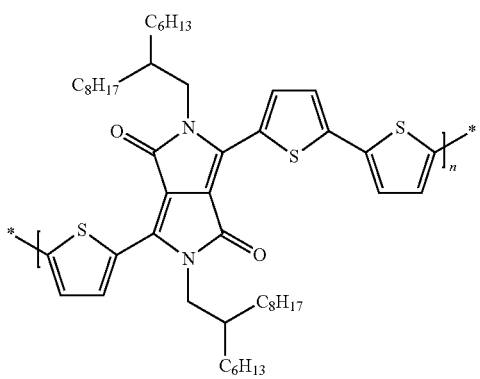

for use in organic field effect transistors (OFETs) and organic photovoltaic devices (OPVs).

Thienothiophene-2,5-dione monomers are known in the art.

JP 04-338761 describes a photoreceptor comprising an electrically conductive substrate having thereon a photosensitive layer, which photosensitive layer contains a charge-transporting compound selected from dibenzothiopyran, dihydrophenanthrene, thienothiophene, and indenoindene derivatives. The compound of formula III is an example of a thienothiophene-type charge-transporting compound.

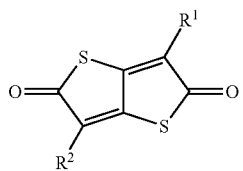

III

DE 39 17 323 A1 describes compounds of formula

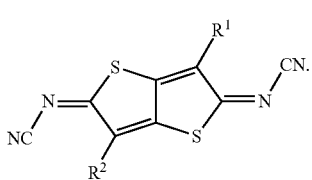

(IV)

as precursors for the preparation of charge transfer complexes comprising a compound of formula

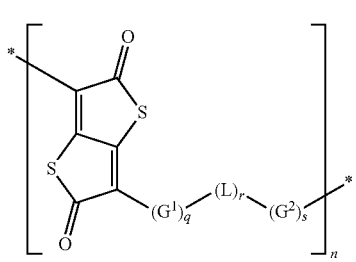

(I)

E. Günther, S. Hünig, Chem. Ber. 1992, 125, 1235-1241 describes compounds of formula

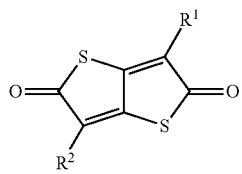

(5)

and their electrochemical properties.

It was the object of the present invention to provide new organic polymeric semiconducting materials.

This object is solved by the polymer of claim 1 and the electronic device of claim 11.

The organic polymeric semiconducting material of the present invention is a polymer comprising a unit of formula $$\left[ \begin{array}{c} \text{structure} \end{array} \right]_n \quad (1)$$

wherein $G^1$ and $G^2$ are independently from each other $C_{6-14}$-arylene optionally substituted with 1 to 6 substituents $R^a$ or bivalent 5 to 14 membered aromatic heterocyclic residue optionally substituted with 1 to 6 substituents $R^a$, wherein $R^a$ at each occurrence are independently from each other selected from the group consisting of =O, =C(CN)$_2$, —O—$C_{2-6}$-alkylene-O—, halogen, —CN, —NO$_2$, —OH, $C_{1-30}$-alkoxy, —O—CH$_2$CH$_2$O—$C_{1-30}$-alkyl, —O—COR$^1$, —S—$C_{1-30}$-alkyl, —NH$_2$, —NHR$^1$, —NR$^1$R$^2$, —NH—COR$^1$, —COOH, —COOR$^1$, —CONH$_2$, —CONHR$^1$, —CONR$^1$R$^2$, —CO—H, —COR$^1$, $C_{1-30}$-alkyl optionally substituted with 1 to 6 substituents $R^c$, $C_{2-30}$-alkenyl optionally substituted with 1 to 6 substituents $R^c$, $C_{2-30}$-alkynyl optionally substituted with 1 to 6 substituents $R^c$, $C_{3-10}$-cycloalkyl optionally substituted with 1 to 6 substituents $R^d$, $C_{5-10}$-cycloalkenyl optionally substituted with 1 to 6 substituents $R^d$ and monovalent 3 to 14 membered aliphatic heterocyclic residue optionally substituted with 1 to 6 substituents $R^d$, wherein $R^1$ and $R^2$ at each occurrence are independently from each other selected from the group consisting of $C_{1-30}$-alkyl, $C_{2-30}$-alkenyl, $C_{2-30}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue, $R^c$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—C$_{1-10}$-alkyl, —O—COR$^3$, —S—C$_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, C$_{3-10}$-cycloalkyl, monovalent 3 to 14 membered aliphatic heterocyclic residue, C$_{6-14}$-aryl and monovalent 5 to 14 membered aromatic heterocyclic residue;

R$^d$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^3$, —S—C$_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, C$_{1-10}$-alkyl, C$_{2-10}$-alkenyl, C$_{2-10}$-alkynyl, C$_{6-14}$-aryl and monovalent 5 to 14 membered aromatic heterocyclic residue;

wherein R$^3$ and R$^4$ at each occurrence are independently from each other selected from the group consisting of C$_{1-10}$-alkyl, C$_{2-10}$-alkenyl, C$_{2-10}$-alkynyl, C$_{3-10}$-cycloalkyl, C$_{5-10}$-cycloalkenyl, monovalent 3 to 14 membered aliphatic heterocyclic residue, C$_{6-14}$-aryl and monovalent 5 to 14 membered aromatic heterocyclic residue, or G$^1$ and G$^2$ are independently from each other

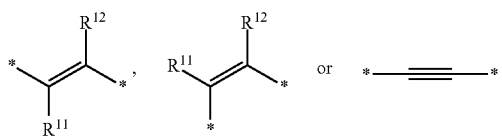

wherein

R$^{11}$ and R$^{12}$ are independently from each other H or C$_{1-30}$-alkyl,

L is C$_{6-24}$-arylene optionally substituted with 1 to 6 substituents R$^b$ or bivalent 5 to 24 membered aromatic heterocyclic residue optionally substituted with 1 to 6 substituents R$^b$, wherein R$^b$ at each occurrence are independently from each other selected from the group consisting of =O, =C(CN)$_2$, —O—C$_{2-6}$-alkylene-O—, halogen, —CN, —NO$_2$, —OH, C$_{1-30}$-alkoxy, —O—CH$_2$CH$_2$O—C$_{1-30}$-alkyl, —O—COR$^5$, —S—C$_{1-30}$-alkyl, —NH$_2$, —NHR$^5$, —NR$^5$R$^6$, —NH—COR$^5$, —COOH, —COOR$^5$, —CONH$_2$, —CONHR$^5$, —CONR$^5$R$^6$, —CO—H, —COR$^5$, C$_{1-30}$-alkyl optionally substituted with 1 to 6 substitutents R$^e$, C$_{2-30}$-alkenyl optionally substituted with 1 to 6 substitutents R$^e$, C$_{2-30}$-alkynyl optionally substituted with 1 to 6 substitutents R$^e$, C$_{3-10}$-cycloalkyl optionally substituted with 1 to 6 substitutents R$^f$, C$_{5-10}$-cycloalkenyl optionally substituted with 1 to 6 substitutents R$^f$ and monovalent 3 to 14 membered aliphatic heterocyclic residue optionally substituted with 1 to 6 substitutents R$^f$, wherein R$^5$ and R$^6$ at each occurrence are independently from each other selected from the group consisting of C$_{1-30}$-alkyl, C$_{2-30}$-alkenyl, C$_{2-30}$-alkynyl, C$_{3-10}$-cycloalkyl, C$_{5-10}$-cycloalkenyl, monovalent 3 to 14 membered aliphatic heterocyclic residue, C$_{6-14}$-aryl and monovalent 5 to 14 membered aromatic heterocyclic residue, R$^e$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^7$, —S—C$_{1-10}$-alkyl, —NH$_2$, —NHR$^7$, —NR$^7$R$^8$, —NH—COR$^7$, —COOH, —COOR$^7$, —CONH$_2$, —CONHR$^7$, —CONR$^7$R$^8$, —CO—H, —COR$^7$, C$_{3-10}$-cycloalkyl, monovalent 3 to 14 membered aliphatic heterocyclic residue, C$_{6-14}$-aryl and monovalent 5 to 14 membered aromatic heterocyclic residue;

R$^f$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^7$, —S—C$_{1-10}$-alkyl, —NH$_2$, —NHR$^7$, —NR$^7$R$^8$, —NH—COR$^7$, —COOH, —COOR$^7$, —CONH$_2$, —CONHR$^7$, —CONR$^7$R$^8$, —CO—H, —COR$^7$, C$_{1-10}$-alkyl, C$_{2-10}$-alkenyl, C$_{2-10}$-alkynyl, C$_{6-14}$-aryl and monovalent 5 to 14 membered aromatic heterocyclic residue;

wherein R$^7$ and R$^8$ at each occurrence are independently from each other selected from the group consisting of C$_{1-10}$-alkyl, C$_{2-10}$-alkenyl, C$_{2-10}$-alkynyl, C$_{3-10}$-cycloalkyl, C$_{5-10}$-cycloalkenyl, monovalent 3 to 14 membered aliphatic heterocyclic residue, C$_{6-14}$-aryl and monovalent 5 to 14 membered aromatic heterocyclic residue, or L is

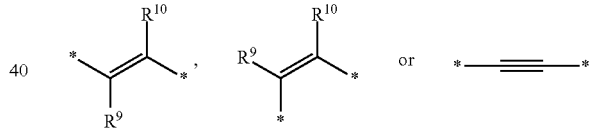

wherein

R$^9$ and R$^{10}$ are independently from each other H, C$_{1-30}$-alkyl, —CN or halogen, q and s are independently from each other 0, 1, 2, 3, 4 or 5, r is 0, 1 or 2, and n is an integer from 2 to 10,000.

Preferably, the organic polymeric semiconducting material of the present invention is a polymer consisting essentially of a unit of formula

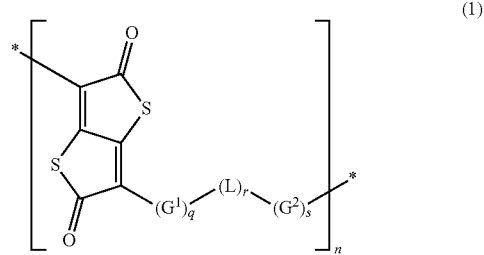

(1)

wherein
- $G^1$ and $G^2$ are independently from each other $C_{6-14}$-arylene optionally substituted with 1 to 6 substituents $R^a$ or bivalent 5 to 14 membered aromatic heterocyclic residue optionally substituted with 1 to 6 substituents $R^a$, wherein
- $R^a$ at each occurrence are independently from each other selected from the group consisting of =O, =C(CN)$_2$, —O—C$_{2-6}$-alkylene-O—, halogen, —CN, —NO$_2$, —OH, C$_{1-30}$-alkoxy, —O—CH$_2$CH$_2$O—C$_{1-30}$-alkyl, —O—COR$^1$, —S—C$_{1-30}$-alkyl, —NH$_2$, —NHR$^1$, —NR$^1$R$^2$, —NH—COR$^1$, —COOH, —COOR$^1$, —CONH$_2$, —CONHR$^1$, —CONR$^1$R$^2$, —CO—H, —COR$^1$, C$_{1-30}$-alkyl optionally substituted with 1 to 6 substituents $R^c$, C$_{2-30}$-alkenyl optionally substituted with 1 to 6 substituents $R^c$, C$_{2-30}$-alkynyl optionally substituted with 1 to 6 substituents $R^c$, C$_{3-10}$-cycloalkyl optionally substituted with 1 to 6 substituents $R^d$, C$_{5-10}$-cycloalkenyl optionally substituted with 1 to 6 substituents Rd and monovalent 3 to 14 membered aliphatic heterocyclic residue optionally substituted with 1 to 6 substituents $R^d$, wherein
- $R^1$ and $R^2$ at each occurrence are independently from each other selected from the group consisting of C$_{1-30}$-alkyl, C$_{2-30}$-alkenyl, C$_{2-30}$-alkynyl, C$_{3-10}$-cycloalkyl, C$_{5-10}$-cycloalkenyl, monovalent 3 to 14 membered aliphatic heterocyclic residue, C$_{6-14}$-aryl and monovalent 5 to 14 membered aromatic heterocyclic residue,
- $R^c$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^3$, —S—C$_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, C$_{3-10}$-cycloalkyl, monovalent 3 to 14 membered aliphatic heterocyclic residue, C$_{6-14}$-aryl and monovalent 5 to 14 membered aromatic heterocyclic residue;
- $R^d$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^3$, —S—C$_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, C$_{1-10}$-alkyl, C$_{2-10}$-alkenyl, C$_{2-10}$-alkynyl, C$_{6-14}$-aryl and monovalent 5 to 14 membered aromatic heterocyclic residue;
  - wherein $R^3$ and $R^4$ at each occurrence are independently from each other selected from the group consisting of C$_{1-10}$-alkyl, C$_{2-10}$-alkenyl, C$_{2-10}$-alkynyl, C$_{3-10}$-cycloalkyl, C$_{5-10}$-cycloalkenyl, monovalent 3 to 14 membered aliphatic heterocyclic residue, C$_{6-14}$-aryl and monovalent 5 to 14 membered aromatic heterocyclic residue, or
$G^1$ and $G^2$ are independently from each other

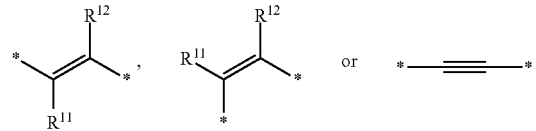

wherein
- $R^{11}$ and $R^{12}$ are independently from each other H or C$_{1-30}$-alkyl,
- L is C$_{6-24}$-arylene optionally substituted with 1 to 6 substituents $R^b$ or bivalent 5 to 24 membered aromatic heterocyclic residue optionally substituted with 1 to 6 substituents $R^b$, wherein
- $R^b$ at each occurrence are independently from each other selected from the group consisting of =O, =C(CN)$_2$, —O—C$_{2-6}$-alkylene-O—, halogen, —CN, —NO$_2$, —OH, C$_{1-30}$-alkoxy, —O—CH$_2$CH$_2$O—C$_{1-30}$-alkyl, —O—COR$^5$, —S—C$_{1-30}$-alkyl, —NH$_2$, —NHR$^5$, —NR$^5$R$^6$, —NH—COR$^5$, —COOH, —COOR$^5$, —CONH$_2$, —CONHR$^5$, —CONR$^5$R$^6$, —CO—H, —COR$^5$, C$_{1-30}$-alkyl optionally substituted with 1 to 6 substituents $R^e$, C$_{2-30}$-alkenyl optionally substituted with 1 to 6 substituents $R^e$, C$_{2-30}$-alkynyl optionally substituted with 1 to 6 substituents $R^e$, C$_{3-10}$-cycloalkyl optionally substituted with 1 to 6 substituents $R^f$, C$_{5-10}$-cycloalkenyl optionally substituted with 1 to 6 substituents $R^f$ and monovalent 3 to 14 membered aliphatic heterocyclic residue optionally substituted with 1 to 6 substituents $R^f$, wherein
- $R^5$ and $R^6$ at each occurrence are independently from each other selected from the group consisting of C$_{1-30}$-alkyl, C$_{2-30}$-alkenyl, C$_{2-30}$-alkynyl, C$_{3-10}$-cycloalkyl, C$_{5-10}$-cycloalkenyl, monovalent 3 to 14 membered aliphatic heterocyclic residue, C$_{6-14}$-aryl and monovalent 5 to 14 membered aromatic heterocyclic residue,
- $R^e$ at each occurrence are independently from each other, selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^7$, —S—C$_{1-10}$-alkyl, —NH$_2$, —NHR$^7$, —NR$^7$R$^8$, —NH—COR$^7$, —COOH, —COOR$^7$, —CONH$_2$, —CONHR$^7$, —CONR$^7$R$^8$, —CO—H, —COR$^7$, C$_{3-10}$-cycloalkyl, monovalent 3 to 14 membered aliphatic heterocyclic residue, C$_{6-14}$-aryl and monovalent 5 to 14 membered aromatic heterocyclic residue;
- $R^f$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^7$, —S—C$_{1-10}$-alkyl, —NH$_2$, —NHR$^7$, —NR$^7$R$^8$, —NH—COR$^7$, —COOH, —COOR$^7$, —CONH$_2$, —CONHR$^7$, —CONR$^7$R$^8$, —CO—H, —COR$^7$, C$_{1-10}$-alkyl, C$_{2-10}$-alkenyl, C$_{2-10}$-alkynyl, C$_{6-14}$-aryl and monovalent 5 to 14 membered aromatic heterocyclic residue;
  - wherein $R^7$ and $R^8$ at each occurrence are independently from each other selected from the group consisting of C$_{1-10}$-alkyl, C$_{2-10}$-alkenyl, C$_{2-10}$-alkynyl, C$_{3-10}$-cycloalkyl, C$_{5-10}$-cycloalkenyl, monovalent 3 to 14 membered aliphatic heterocyclic residue, $C_{6-14}$-aryl and monovalent 5 to 14 membered aromatic heterocyclic residue, or L is

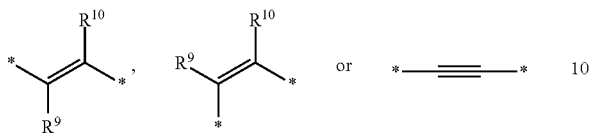

wherein
$R^9$ and $R^{10}$ are independently from each other H, $C_{1-30}$-alkyl, —CN or halogen,
q and s are independently from each other 0, 1, 2, 3, 4 or 5,
r is 0, 1 or 2,
and
n is an integer from 2 to 10,000.

The term "consisting essentially of" means that at least 80% by weight, more preferably at least 90% by weight, of the polymer consists of a unit of formula (1) based on the weight of the polymer.

More preferably, the organic polymeric semiconducting material of the present invention is a polymer of formula

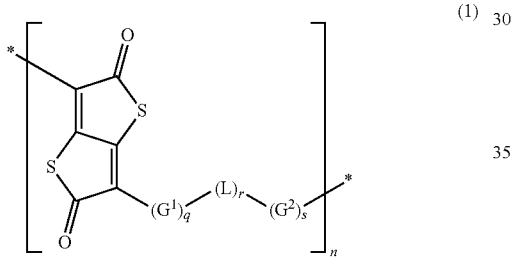

(1)

wherein
$G^1$ and $G^2$ are independently from each other $C_{6-14}$-arylene optionally substituted with 1 to 6 substituents $R^a$ or bivalent 5 to 14 membered aromatic heterocyclic residue optionally substituted with 1 to 6 substituents $R^a$,
wherein
$R^a$ at each occurrence are independently from each other selected from the group consisting of =O, =C(CN)$_2$, —O—C$_{2-6}$-alkylene-O—, halogen, —CN, —NO$_2$, —OH, C$_{1-30}$-alkoxy, —O—CH$_2$CH$_2$O—C$_{1-30}$-alkyl, —O—COR$^1$, —S—C$_{1-30}$-alkyl, —NH$_2$, —NHR$^1$, —NR$^1$R$^2$, —NH—COR$^1$, —COOH, —COOR$^1$, —CONH$_2$, —CONHR$^1$, —CONR$^1$R$^2$, —CO—H, —COR$^1$, C$_{1-30}$-alkyl optionally substituted with 1 to 6 substituents $R^c$, C$_{2-30}$-alkenyl optionally substituted with 1 to 6 substituents $R^c$, C$_{2-30}$-alkynyl optionally substituted with 1 to 6 substituents $R^c$, C$_{3-10}$-cycloalkyl optionally substituted with 1 to 6 substituents $R^d$, C$_{5-10}$-cycloalkenyl optionally substituted with 1 to 6 substituents $R^d$ and monovalent 3 to 14 membered aliphatic heterocyclic residue optionally substituted with 1 to 6 substituents $R^d$,
wherein
$R^1$ and $R^2$ at each occurrence are independently from each other selected from the group consisting of C$_{1-30}$-alkyl, C$_{2-30}$-alkenyl, C$_{2-30}$-alkynyl, C$_{3-10}$-cycloalkyl, C$_{5-10}$-cycloalkenyl, monovalent 3 to 14 membered aliphatic heterocyclic residue, $C_{6-14}$-aryl and monovalent 5 to 14 membered aromatic heterocyclic residue, $R^c$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^3$, —S—C$_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, C$_{3-10}$-cycloalkyl, monovalent 3 to 14 membered aliphatic heterocyclic residue, $C_{6-14}$-aryl and monovalent 5 to 14 membered aromatic heterocyclic residue;

$R^d$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^3$, —S—C$_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, C$_{1-10}$-alkyl, C$_{2-10}$-alkenyl, C$_{2-10}$-alkynyl, $C_{6-14}$-aryl and monovalent 5 to 14 membered aromatic heterocyclic residue;

wherein $R^3$ and $R^4$ at each occurrence are independently from each other selected from the group consisting of C$_{1-10}$-alkyl, C$_{2-10}$-alkenyl, C$_{2-10}$-alkynyl, C$_{3-10}$-cycloalkyl, C$_{5-10}$-cycloalkenyl, monovalent 3 to 14 membered aliphatic heterocyclic residue, $C_{6-14}$-aryl and monovalent 5 to 14 membered aromatic heterocyclic residue, or $G^1$ and $G^2$ are independently from each other

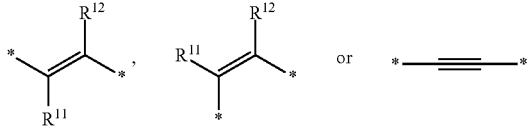

wherein
$R^{11}$ and $R^{12}$ are independently from each other H or C$_{1-30}$-alkyl,
L is C$_{6-24}$-arylene optionally substituted with 1 to 6 substituents $R^b$ or bivalent 5 to 24 membered aromatic heterocyclic residue optionally substituted with 1 to 6 substituents $R^b$,
wherein
$R^b$ at each occurrence are independently from each other selected from the group consisting of =O, =C(CN)$_2$, —O—C$_{2-6}$-alkylene-O—, halogen, —CN, —NO$_2$, —OH, C$_{1-30}$-alkoxy, —O—CH$_2$CH$_2$O—C$_{1-30}$-alkyl, —O—COR$^5$, —S—C$_{1-30}$-alkyl, —NH$_2$, —NHR$^5$, —NR$^5$R$^6$, —NH—COR$^5$, —COOH, —COOR$^5$, —CONH$_2$, —CONHR$^5$, —CONR$^5$R$^6$, —CO—H, —COR$^5$, C$_{1-30}$-alkyl optionally substituted with 1 to 6 substitutents $R^e$, C$_{2-30}$-alkenyl optionally substituted with 1 to 6 substituents $R^e$, C$_{2-30}$-alkynyl optionally substituted with 1 to 6 substituents $R^e$, C$_{3-10}$-cycloalkyl optionally substituted with 1 to 6 substitutents $R^1$, C$_{5-10}$-cycloalkenyl optionally substituted with 1 to 6 substitutents $R^f$ and monovalent 3 to 14 membered aliphatic heterocyclic residue optionally substituted with 1 to 6 substitutents $R^f$,
wherein
$R^5$ and $R^6$ at each occurrence are independently from each other selected from the group consisting of $C_{1-30}$-alkyl, $C_{2-30}$-alkenyl, $C_{2-30}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue,
$R^e$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^7$, —S—$C_{1-10}$-alkyl, —NH$_2$, —NHR$^7$, —NR$^7$R$^8$, —NH—COR$^7$, —COOH, —COOR$^7$, —CONH$_2$, —CONHR$^7$, —CONR$^7$R$^8$, —CO—H, —COR$^7$, $C_{3-10}$-cycloalkyl, monovalent 3 to 14 membered aliphatic heterocyclic residue, $C_{6-14}$-aryl and monovalent 5 to 14 membered aromatic heterocyclic residue;
$R^f$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^7$, —S—$C_{1-10}$-alkyl, —NH$_2$, —NHR$^7$, —NR$^7$R$^8$, —NH—COR$^7$, —COOH, —COOR$^7$, —CONH$_2$, —CONHR$^7$, —CONR$^7$R$^8$, —CO—H, —COR$^7$, $C_{1-10}$-alkyl, $C_{2-10}$-alkenyl, $C_{2-10}$-alkynyl, $C_{6-14}$-aryl and monovalent 5 to 14 membered aromatic heterocyclic residue;
wherein $R^7$ and $R^8$ at each occurrence are independently from each other selected from the group consisting of $C_{1-10}$-alkyl, $C_{2-10}$-alkenyl, $C_{2-10}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue,
or
L is

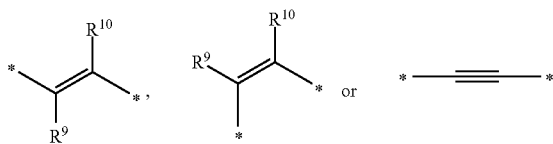

wherein
$R^9$ and $R^{10}$ are independently from each other H, $C_{1-30}$-alkyl, —CN or halogen,
q and s are independently from each other 0, 1, 2, 3, 4 or 5,
r is 0, 1 or 2,
and
n is an integer from 2 to 10,000.

$C_{1-10}$-alkyl and $C_{1-30}$-alkyl can be branched or unbranched. Examples of $C_{1-10}$-alkyl are methyl, ethyl, n-propyl, isopropyl, n-butyl, sec-butyl, isobutyl, tert-butyl, n-pentyl, neopentyl, isopentyl, n-(1-ethyl)propyl, n-hexyl, n-heptyl, n-octyl, n-(2-ethyl)hexyl, n-nonyl and n-decyl. Examples of $C_{1-30}$-alkyl are $C_{1-10}$-alkyl, and n-undecyl, n-dodecyl, n-undecyl, n-dodecyl, n-tridecyl, n-tetradecyl, n-pentadecyl, n-hexadecyl, n-heptadecyl, n-octadecyl, n-nonadecyl and n-icosyl ($C_{20}$), n-docosyl ($C_{22}$), n-tetracosyl ($C_{24}$), n-hexacosyl ($C_{26}$), n-octacosyl ($C_{28}$) and n-triacontyl ($C_{30}$). Examples of $C_{6-20}$-alkyl are n-hexyl, n-heptyl, n-octyl, n-(2-ethyl)hexyl, n-nonyl, n-decyl, n-undecyl, n-dodecyl, n-undecyl, n-dodecyl, n-tridecyl, n-tetradecyl, n-pentadecyl, n-hexadecyl, n-heptadecyl, n-octadecyl, n-nonadecyl and n-icosyl ($C_{20}$). Examples of $C_{8-16}$-alkyl are n-octyl, n-(2-ethyl)hexyl, n-nonyl, n-decyl, n-undecyl, n-dodecyl, n-undecyl, n-dodecyl, n-tridecyl, n-tetradecyl, n-pentadecyl and n-hexadecyl.

$C_{2-10}$-alkenyl and $C_{2-30}$-alkenyl can be branched or unbranched. Examples of $C_{2-10}$-alkenyl are vinyl, propenyl, cis-2-butenyl, trans-2-butenyl, 3-butenyl, cis-2-pentenyl, trans-2-pentenyl, cis-3-pentenyl, trans-3-pentenyl, 4-pentenyl, 2-methyl-3-butenyl, hexenyl, heptenyl, octenyl, nonenyl and docenyl. Examples of $C_{2-30}$-alkenyl are $C_{2-10}$-alkenyl, and linoleyl ($C_{18}$), linolenyl ($C_{18}$), oleyl ($C_{18}$), arachidonyl ($C_{20}$), and erucyl ($C_{22}$).

$C_{2-10}$-alkynyl and $C_{2-30}$-alkynyl can be branched or unbranched. Examples of $C_{2-10}$-alkynyl are ethynyl, 2-propynyl, 2-butynyl, 3-butynyl, pentynyl, hexynyl, heptynyl, octynyl, nonynyl and decynyl. Examples of $C_{2-30}$-alkynyl are $C_{2-10}$-alkynyl, and undecynyl, dodecynyl, undecynyl, dodecynyl, tridecynyl, tetradecynyl, pentadecynyl, hexadecynyl, heptadecynyl, octadecynyl, nonadecynyl and icosynyl ($C_{20}$).

Examples of $C_{3-10}$-cycloalkyl are preferably monocyclic $C_{3-10}$-cycloalkyls such as cyclopropyl, cyclobutyl, cyclopentyl, cyclohexyl, cycloheptyl and cyclooctyl, but include also polycyclic $C_{3-10}$-cycloalkyls such as decalinyl, norbornyl and adamantyl.

Examples of $C_{5-10}$-cycloalkenyl are preferably monocyclic $C_{5-10}$-cycloalkenyls such as cyclopentenyl, cyclohexenyl, cyclohexadienyl and cycloheptatrienyl, but include also polycyclic $C_{5-10}$-cycloalkenyls.

Examples of monovalent 3 to 14 membered aliphatic heterocyclic residues are monocyclic monovalent 3 to 8 membered aliphatic cyclic residues and polycyclic, for example bicyclic monovalent 7 to 12 membered aliphatic heterocyclic residues.

Examples of monocyclic monovalent 3 to 8 membered aliphatic heterocyclic residues are monocyclic monovalent 5 membered aliphatic heterocyclic residues containing one heteroatom such as pyrrolidinyl, 1-pyrrolinyl, 2-pyrrolinyl, 3-pyrrolinyl, tetrahydrofuryl, 2,3-dihydrofuryl, tetrahydrothiophenyl and 2,3-dihydrothiophenyl, monocyclic monovalent 5 membered aliphatic heterocyclic residues containing two heteroatoms such as imidazolidinyl, imidazolinyl, pyrazolidinyl, pyrazolinyl, oxazolidinyl, oxazolinyl, isoxazolidinyl, isoxazolinyl, thiazolidinyl, thiazolinyl, isothiazolidinyl and isothiazolinyl, monocyclic monovalent 5 membered aliphatic heterocyclic residues containing three heteroatoms such as 1,2,3-triazolyl, 1,2,4-triazolyl and 1,4, 2-dithiazolyl, monocyclic monovalent 6 membered aliphatic heterocyclic residues containing one heteroatom such as piperidyl, piperidino, tetrahydropyranyl, pyranyl, thianyl and thiopyranyl, monocyclic monovalent 6 membered aliphatic heterocyclic residues containing two heteroatoms such as piperazinyl, morpholinyl and morpholino and thiazinyl, monocyclic monovalent 7 membered aliphatic heterocyclic residues containing one hereoatom such as azepanyl, azepinyl, oxepanyl, thiepanyl, thiapanyl, thiepinyl, and monocyclic monovalent 7 membered aliphatic heterocyclic residues containing two hereoatom such as 1,2-diazepinyl and 1,3-thiazepinyl.

An example of a bicyclic monovalent 7-12 membered aliphatic heterocyclic residue is decahydronaphthyl.

$C_{6-14}$-aryl can be monocyclic or polycyclic. Examples of $C_{6-14}$-aryl are monocyclic $C_6$-aryl such as phenyl, bicyclic $C_{9-10}$-aryl such as 1-naphthyl, 2-naphthyl, indenyl, indanyl and tetrahydronaphthyl, and tricyclic $C_{12-14}$-aryl such as anthryl, phenanthryl, fluorenyl and s-indacenyl.

The monovalent 5 to 14 membered aromatic heterocyclic residues can be monocyclic monovalent 5 to 8 membered aromatic heterocyclic residues, or polycyclic, for example bicyclic monovalent 7 to 12 membered, tricyclic monovalent 9 to 14 membered aromatic heterocyclic residue, or tetracyclic monovalent 9 to 14 membered aromatic heterocyclic residues.

Examples of monocyclic monovalent 5 to 8 membered aromatic heterocyclic residues are monocyclic monovalent 5 membered aromatic heterocyclic residues containing one heteroatom such as pyrrolyl, furyl and thiophenyl, monocyclic monovalent 5 membered aromatic heterocyclic residues containing two heteroatoms such as imidazolyl, pyrazolyl, oxazolyl, isoxazolyl, thiazolyl, isothiazolyl, monocyclic monovalent 5 membered aromatic heterocyclic residues containing three heteroatoms such as 1,2,3-triazolyl, 1,2,4-triazolyland oxadiazolyl, monocyclic monovalent 5 membered aromatic heterocyclic residues containing four heteroatoms such as tetrazolyl, monocyclic monovalent 6 membered aromatic heterocyclic residues containing one heteroatom such as pyridyl, monocyclic monovalent 6 membered aromatic heterocyclic residues containing two heteroatoms such as pyrazinyl, pyrimidinyl and pyridazinyl, monocyclic monovalent 6 membered aromatic heterocyclic residues containing three heteroatoms such as 1,2,3-triazinyl, 1,2,4-triazinyl and 1,3,5-triazinyl, monocyclic monovalent 7 membered aromatic heterocyclic residues containing one heteroatom such as azepinyl, and monocyclic monovalent 7 membered aromatic heterocyclic residues containing two heteroatoms such as 1,2-diazepinyl, Examples of bicyclic monovalent 7 to 12 membered aromatic heterocyclic residues are bicyclic monovalent 8 membered aromatic heterocyclic residues containing two heteroatoms such as thieno[3,2-b]thiophenyl, bicyclic 9 membered aromatic heterocyclic residues containing one heteroatom such as indolyl, isoindolyl, indolizinyl, indolinyl, benzofuryl, isobenzofuryl, benzothiophenyl and isobenzothiophenyl, bicyclic monovalent 9 membered aromatic heterocyclic residues containing two heteroatoms such as indazolyl, benzimidazolyl, benzimidazolinyl, benzoxazolyl, benzisooxazolyl, benzthiazolyl, benzisothiazolyl, furopyridyl and thienopyridyl, bicyclic monovalent 9 membered aromatic heterocyclic residues containing three heteroatoms such as benzotriazolyl, benzoxadiazolyl, oxazolopyridyl, isooxazolopyridyl, thiazolopyridyl, isothiazolopyridyl and imidazopyridyl, bicyclic monovalent 9 membered aromatic heterocyclic residues containing four heteroatoms such as purinyl, bicyclic monovalent 10 membered aromatic heterocyclic residues containing one heteroatom such as quinolyl, isoquinolyl, chromenyl and chromanyl, bicyclic monovalent 10 membered aromatic heterocyclic residues containing two heteroatoms such as quinoxalinyl, quinazolinyl, cinnolinyl, phthalazinyl, 1,5-naphthyridinyl and 1,8-naphthyridinyl, bicyclic monovalent 10 membered aromatic heterocyclic residues containing three heteroatoms such as pyridopyrazinyl, pyridopyrimidinyl and pyridopyridazinyl, and bicyclic monovalent 10 membered aromatic heterocyclic residues containing four heteroatoms such as pteridinyl.

Examples of tricyclic monovalent 9 to 14 membered aromatic heterocyclic residues are dibenzofuryl, acridinyl, phenoxazinyl, 7H-cyclopenta[1,2-b:3,4-b']dithiophenyl and 4H-cyclopenta-[2,1-b:3,4-b']dithiophenyl. An example of a tricyclic monovalent 9 to 14 membered aromatic heterocyclic residue containing three heteroatoms is dithienothiophenyl of formula

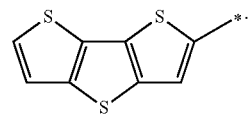

An example of a tricyclic monovalent 9 to 14 membered aromatic heterocyclic residue containing four heteroatoms is trithienothiophenyl of formula

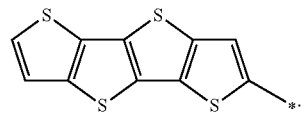

Examples of halogen are —F, —Cl, —Br and —I.

Examples of $C_{1-10}$-alkoxy are methoxy, ethoxy, n-propoxy, isopropoxy, n-butoxy, sec-butoxy, isobutoxy, tert-butoxy, n-pentoxy, neopentoxy, isopentoxy, hexoxy, n-heptoxy, n-octoxy, n-nonoxy and n-decoxy. Examples of $C_{1-30}$-alkoxy are $C_{1-10}$-alkoxy, and n-undecoxy, n-dodecoxy, n-undecoxy, n-dodecoxy, n-tridecoxy, n-tetradecoxy, n-pentadecoxy, n-hexadecoxy, n-heptadecoxy, n-octadecoxy, n-nonadecoxy and n-icosoxy ($C_{20}$), n-docosoxy ($C_{22}$), n-tetracosoxy ($C_{24}$), n-hexacosoxy ($C_{26}$), n-octacosoxy ($C_{28}$) and n-triacontoxy ($C_{30}$).

Examples of $C_{2-6}$-alkylene are ethylene, butylene, pentylene, hexylene and 2-methylpentylene.

Examples of $C_{6-14}$-arylene are monocyclic $C_6$-arylene such as phenylene, bicyclic $C_{9-10}$-arylene such as naphthylene, for example

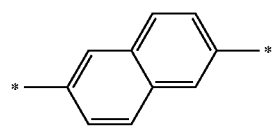

indenylene, for example

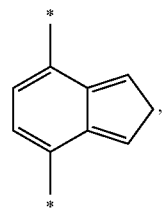

indanylene, for example
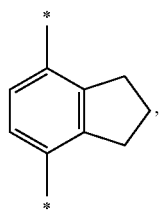
and tetrahydronaphthylene, for example
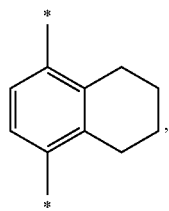
and tricyclic $C_{12-14}$-arylene such as anthrylene, for example
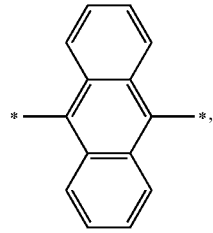
phenanthrylene, for example
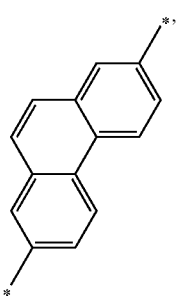 [SMILES: Cc1ccc2c(ccc3cc(C)ccc32)c1]
fluorenylene, for example
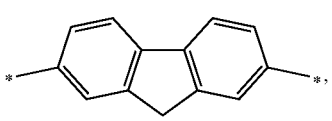
and
s-indacenylene, for example
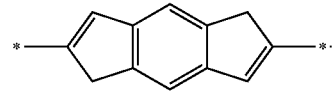
Examples of $C_{6-24}$-arylene are $C_{6-14}$-arylene and
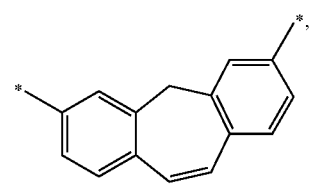
pyrenylene, for example
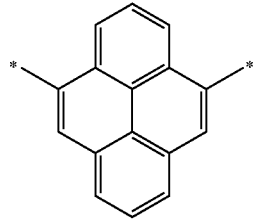 and 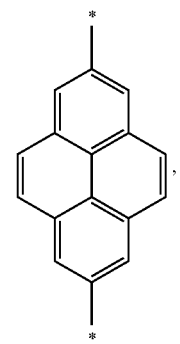
tetracenylene, for example
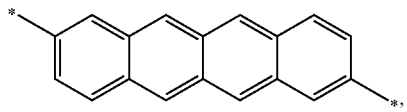
perylenylene, for example
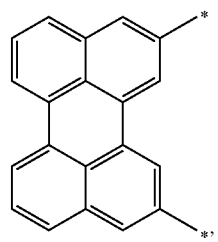 [SMILES: Cc1cc2cccc3c4cccc5cc(C)cc(c(c1)c23)c54]

indenofluorenylene, for example

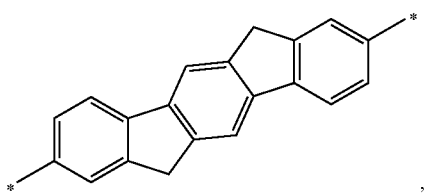

pentacenylene, for example

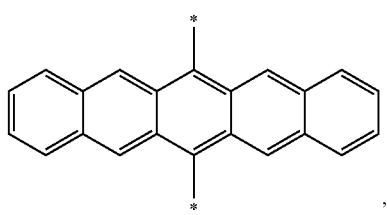 [SMILES: Cc1c2cc3ccccc3cc2c(C)c2cc3ccccc3cc12]

coronenylene, for example

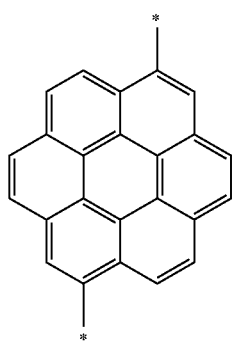 [SMILES: Cc1cc2ccc3ccc4c(C)cc5ccc6ccc1c1c6c5c4c3c21]

and tetraphenylenylene, for example

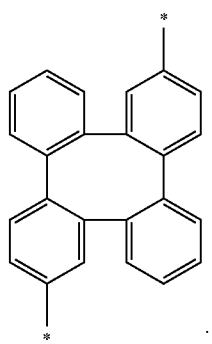 [SMILES: Cc1ccc2c(c1)-c1ccccc1-c1ccc(C)cc1-c1ccccc1-2]

The bivalent 5 to 14 membered aromatic heterocyclic residues can be monocyclic bivalent 5 to 8 membered aromatic heterocyclic residues, or polycyclic, for example bicyclic bivalent 7 to 14 membered, tricyclic bivalent 9 to 14 membered aromatic heterocyclic residues, or tetracyclic bivalent 9 to 14 membered aromatic heterocyclic residues.

Examples of monocyclic bivalent 5 to 8 membered aromatic heterocyclic residues are monocyclic bivalent 5 membered aromatic heterocyclic residues containing one heteroatom such as pyrrolylene, furylene and thiophenylene, monocyclic bivalent 5 membered aromatic heterocyclic residues containing two heteroatoms such as imidazolylene, pyrazolylene, oxazolylene, isoxazolylene, thiazolylene, isothiazolylene, monocyclic bivalent 5 membered aromatic heterocyclic residues containing three heteroatoms such as 1,2,3-triazolylene, 1,2,4-triazolylene and oxadiazolylene, monocyclic bivalent 5 membered aromatic heterocyclic residues containing four heteroatoms such as tetrazolylene, monocyclic bivalent 6 membered aromatic heterocyclic residues containing one heteroatom such as pyridylene, monocyclic bivalent 6 membered aromatic heterocyclic residues containing two heteroatoms such as pyrazinylene, pyrimidinylene and pyridazinylene, monocyclic bivalent 6 membered aromatic heterocyclic residues containing three heteroatoms such as 1,2,3-triazinylene, 1,2,4-triazinylene and 1,3,5-triazinylene, monocyclic bivalent 7 membered aromatic heterocyclic residues containing one heteroatom such as azepinylene, and monocyclic bivalent 7 membered aromatic heterocyclic residues containing two heteroatoms such as 1,2-diazepinylene.

Examples of bicyclic bivalent 7 to 14 membered aromatic heterocyclic residues are bicyclic bivalent 8 membered aromatic heterocyclic residues containing two heteroatoms such as thienothiophenylene, for example

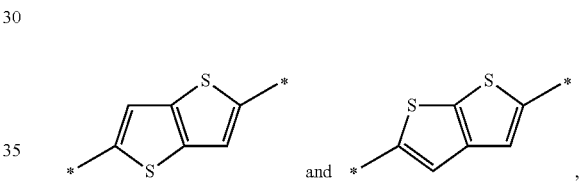

and bicyclic bivalent 8 membered aromatic heterocyclic residues containing three heteroatoms such as thienothiazolylene, for example

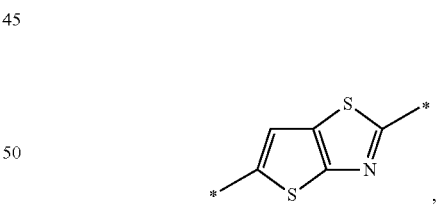

bicyclic bivalent 8 membered aromatic heterocyclic residues containing four heteroatoms such as thiazothiazolylene, for example

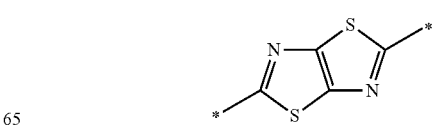

bicyclic bivalent 9 membered aromatic heterocyclic residues containing one heteroatom such as indolylene, isoindolylene, indolizinylene, indolinylene, isoindolinylene, for example

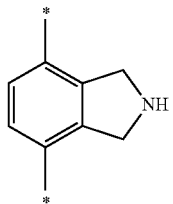

benzofurylene, isobenzofurylene, benzothiophenylene and isobenzothiophenylene, bicyclic bivalent 9 membered aromatic heterocyclic residues containing two heteroatoms such as indazolylene, benzimidazolylene, benzimidazolinylene, benzoxazolylene, benzisooxazolylene, benzthiazolylene, benzisothiazolylene, furopyridylene and thienopyridylene, bicyclic bivalent 9 membered aromatic heterocyclic residues containing three heteroatoms such as benzotriazolylene, benzoxadiazolylene, oxazolopyridylene, isooxazolopyridylene, thiazolopyridylene, isothiazolopyridylene, imidazopyridylene, benzothiadiazolylene, for example

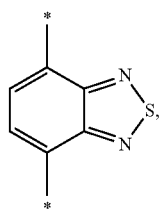

and dioxanothiophenylene, for example

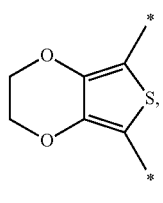

bicyclic bivalent 9 membered aromatic heterocyclic residues containing four heteroatoms such as purinylene, bicyclic bivalent 10 membered aromatic heterocyclic residues containing one heteroatom such as quinolylene, isoquinolylene, chromenylene and chromanylene, bicyclic bivalent 10 membered aromatic heterocyclic residues containing two heteroatoms such as quinoxalinylene, for example

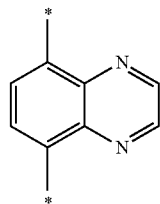

quinazolinylene, cinnolinylene, phthalazinylene, 1,5-naphthyridinylene and 1,8-naphthyridinylene, bicyclic bivalent 10 membered aromatic heterocyclic residues containing three heteroatoms such as pyridopyrazinylene, pyridopyrimidinylene and pyridopyridazinylene, and bicyclic bivalent 10 membered aromatic heterocyclic residues containing four heteroatoms such as pteridinylene.

Examples of tricyclic bivalent 9 to 14 membered aromatic heterocyclic residues containing one heteroatom are dibenzofurylene, acridinylene, dibenzosilacyclopentadienylene, for example

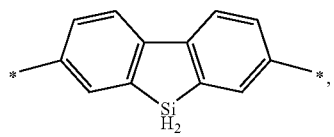

and dibenzopyrrolylene, for example

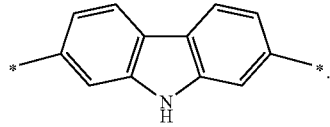

Examples of a tricyclic bivalent 9 to 14 membered aromatic heterocyclic residues containing two heteroatoms are phenoxazinylene, and the following compounds

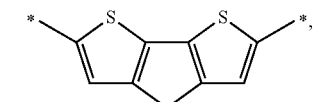

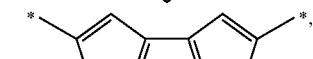

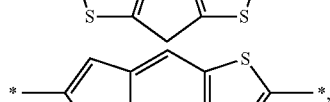

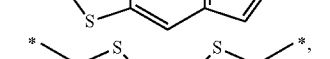

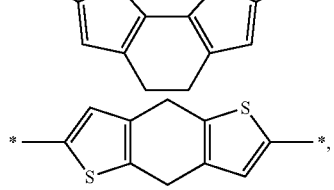

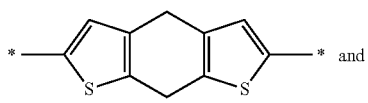 and

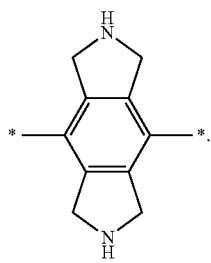

Examples of tricyclic bivalent 9 to 14 membered aromatic heterocyclic residue containing three heteroatoms are the following compounds

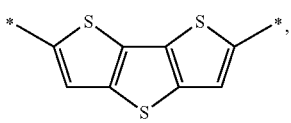,

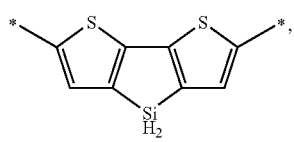,

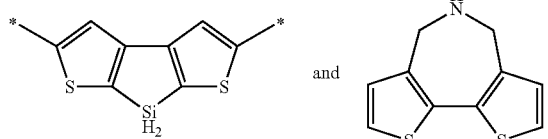 and 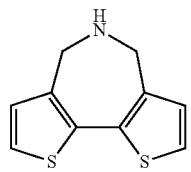

Examples of tricyclic bivalent 9 to 14 membered aromatic heterocyclic residue containing four-heteroatoms are the following compounds

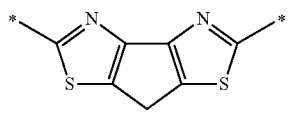 and

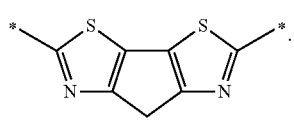.

An example of a tricyclic bivalent 9 to 14 membered aromatic heterocyclic residue containing six heteroatoms is the following compound

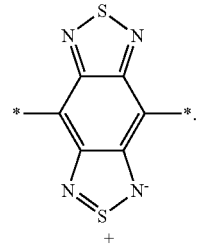

An example of a tetracyclic bivalent 9 to 14 membered aromatic heterocyclic residue containing four heteroatoms is the following compound

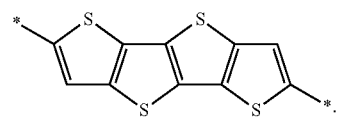

Examples of bivalent 5 to 24 membered aromatic heterocyclic residues are bivalent 5 to 14 membered aromatic heterocyclic residues, and the following compounds

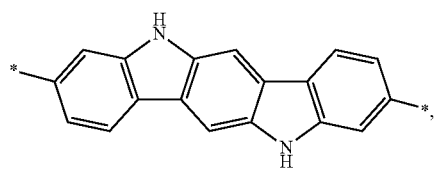,

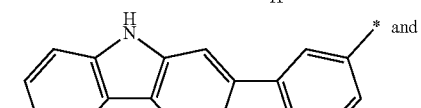 and

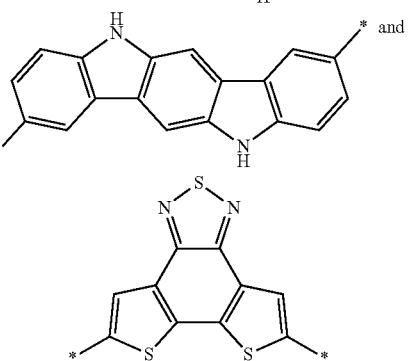

Examples of L are:

,

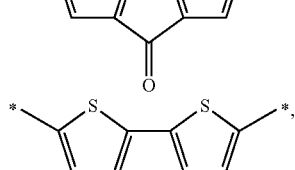,

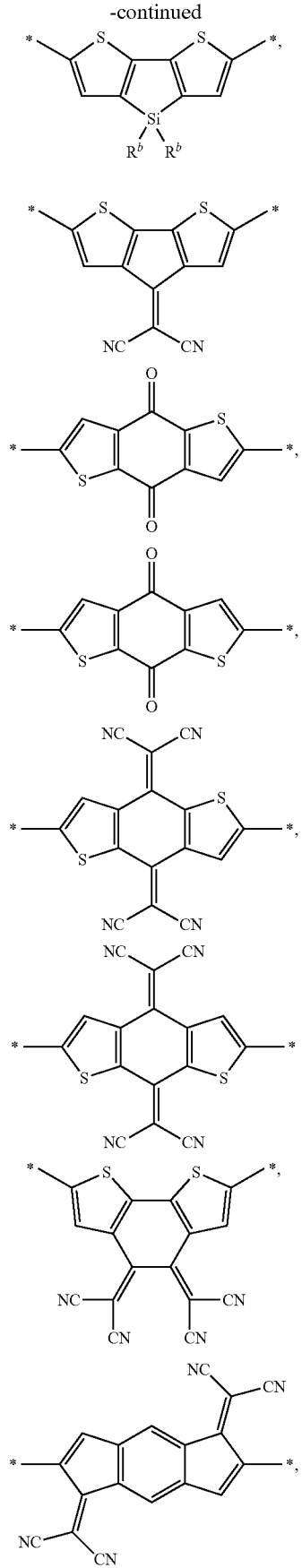
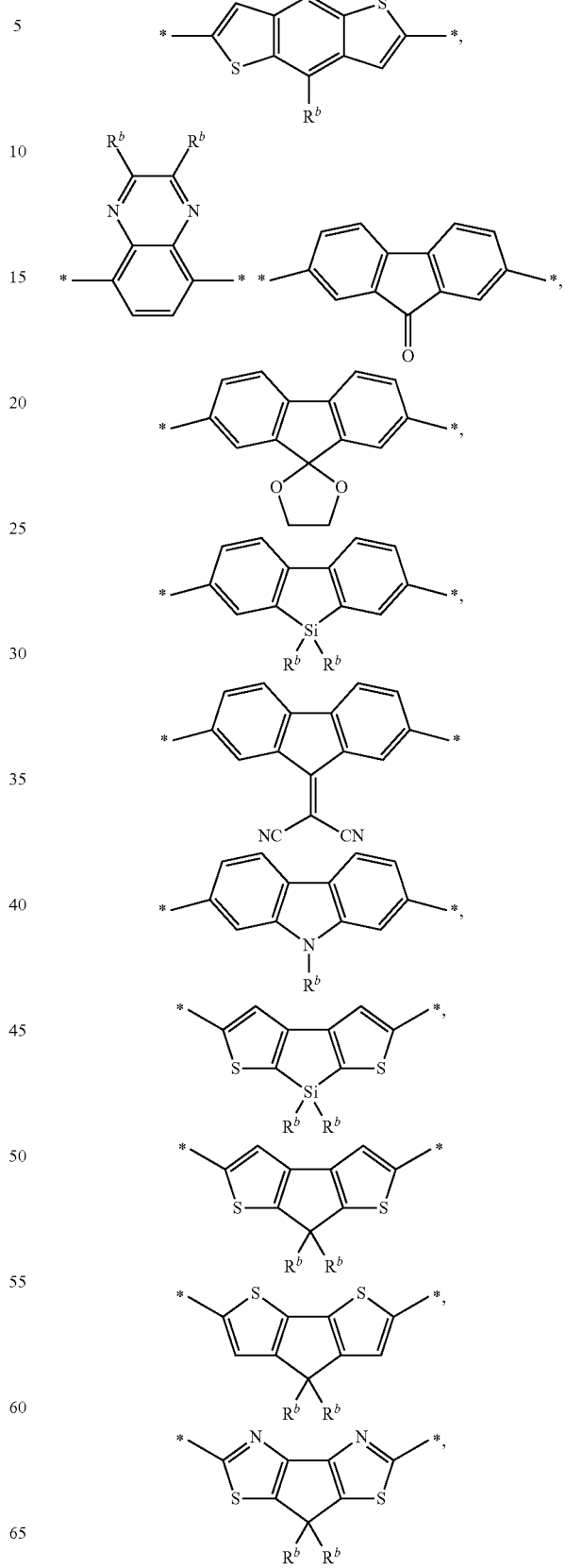

-continued

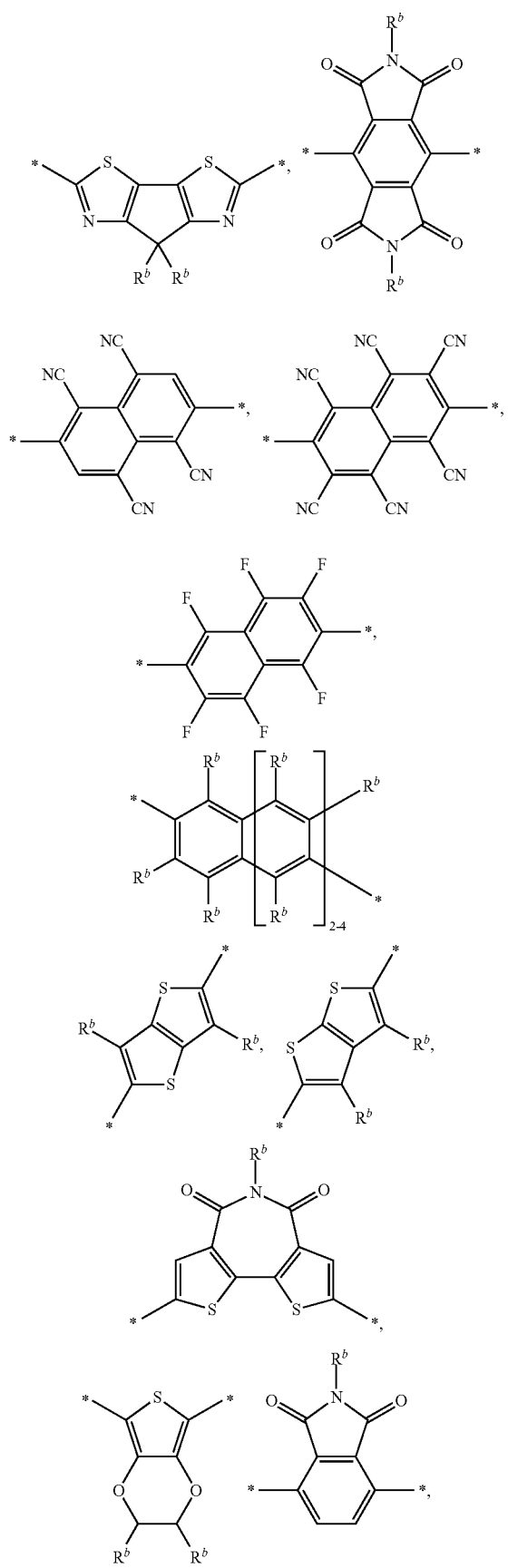

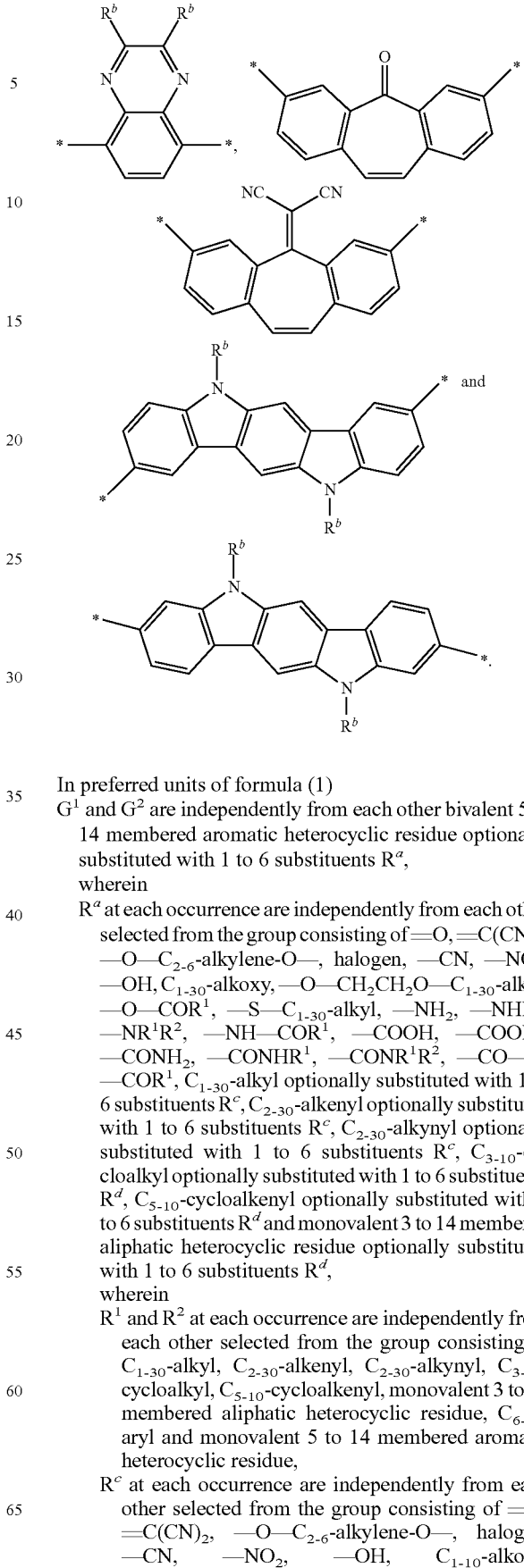

In preferred units of formula (1)
G$^1$ and G$^2$ are independently from each other bivalent 5 to 14 membered aromatic heterocyclic residue optionally substituted with 1 to 6 substituents R$^a$,
wherein
R$^a$ at each occurrence are independently from each other selected from the group consisting of =O, =C(CN)$_2$, —O—C$_{2-6}$-alkylene-O—, halogen, —CN, —NO$_2$, —OH, C$_{1-30}$-alkoxy, —O—CH$_2$CH$_2$O—C$_{1-30}$-alkyl, —O—COR$^1$, —S—C$_{1-30}$-alkyl, —NH$_2$, —NHR$^1$, —NR$^1$R$^2$, —NH—COR$^1$, —COOH, —COOR$^1$, —CONH$_2$, —CONHR$^1$, —CONR$^1$R$^2$, —CO—H, —COR$^1$, C$_{1-30}$-alkyl optionally substituted with 1 to 6 substituents R$^c$, C$_{2-30}$-alkenyl optionally substituted with 1 to 6 substituents R$^c$, C$_{2-30}$-alkynyl optionally substituted with 1 to 6 substituents R$^c$, C$_{3-10}$-cycloalkyl optionally substituted with 1 to 6 substituents R$^d$, C$_{5-10}$-cycloalkenyl optionally substituted with 1 to 6 substituents R$^d$ and monovalent 3 to 14 membered aliphatic heterocyclic residue optionally substituted with 1 to 6 substituents R$^d$,
wherein
R$^1$ and R$^2$ at each occurrence are independently from each other selected from the group consisting of C$_{1-30}$-alkyl, C$_{2-30}$-alkenyl, C$_{2-30}$-alkynyl, C$_{3-10}$-cycloalkyl, C$_{5-10}$-cycloalkenyl, monovalent 3 to 14 membered aliphatic heterocyclic residue, C$_{6-14}$-aryl and monovalent 5 to 14 membered aromatic heterocyclic residue,
R$^c$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^3$, —S—C$_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, C$_{3-10}$-cycloalkyl, monovalent 3 to 14 membered aliphatic heterocyclic residue, C$_{6-14}$-aryl and monovalent 5 to 14 membered aromatic heterocyclic residue;

R$^d$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^3$, —S—C$_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, C$_{1-10}$-alkyl, C$_{2-10}$-alkenyl, C$_{2-10}$-alkynyl, C$_{6-14}$-aryl and monovalent 5 to 14 membered aromatic heterocyclic residue;

wherein R$^3$ and R$^4$ at each occurrence are independently from each other selected from the group consisting of C$_{1-10}$-alkyl, C$_{2-10}$-alkenyl, C$_{2-10}$-alkynyl, C$_{3-10}$-cycloalkyl, C$_{5-10}$-cycloalkenyl, monovalent 3 to 14 membered aliphatic heterocyclic residue, C$_{6-14}$-aryl and monovalent 5 to 14 membered aromatic heterocyclic residue, L is bivalent 5 to 24 membered aromatic heterocyclic residue optionally substituted with 1 to 6 substituents R$^b$, wherein R$^b$ at each occurrence are independently from each other selected from the group consisting of =O, =C(CN)$_2$, —O—C$_{2-6}$-alkylene-O—, halogen, —CN, —NO$_2$, —OH, C$_{1-30}$-alkoxy, —O—CH$_2$CH$_2$O—C$_{1-30}$-alkyl, —O—COR$^5$, —S—C$_{1-30}$-alkyl, —NH$_2$, —NHR$^5$, —NR$^5$R$^6$, —NH—COR$^5$, —COOH, —COOR$^5$, —CONH$_2$, —CONHR$^5$, —CONR$^5$R$^6$, —CO—H, —COR$^5$, C$_{1-30}$-alkyl optionally substituted with 1 to 6 substituents R$^e$, C$_{2-30}$-alkenyl optionally substituted with 1 to 6 substituents R$^e$, C$_{2-30}$-alkynyl optionally substituted with 1 to 6 substituents R$^e$, C$_{3-10}$-cycloalkyl optionally substituted with 1 to 6 substituents R$^f$, C$_{5-10}$-cycloalkenyl optionally substituted with 1 to 6 substituents R$^f$ and monovalent 3 to 14 membered aliphatic heterocyclic residue optionally substituted with 1 to 6 substituents R$^f$, wherein R$^5$ and R$^6$ at each occurrence are independently from each other selected from the group consisting of C$_{1-30}$-alkyl, C$_{2-30}$-alkenyl, C$_{2-30}$-alkynyl, C$_{3-10}$-cycloalkyl, C$_{5-10}$-cycloalkenyl, monovalent 3 to 14 membered aliphatic heterocyclic residue, C$_{6-14}$-aryl and monovalent 5 to 14 membered aromatic heterocyclic residue, R$^e$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^7$, —S—C$_{1-10}$-alkyl, —NH$_2$, —NHR$^7$, —NR$^7$R$^8$, —NH—COR$^7$, —COOH, —COOR$^7$, —CONH$_2$, —CONHR$^7$, —CONR$^7$R$^8$, —CO—H, —COR$^7$, C$_{3-10}$-cycloalkyl, monovalent 3 to 14 membered aliphatic heterocyclic residue, C$_{6-14}$-aryl and monovalent 5 to 14 membered aromatic heterocyclic residue;

R$^f$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^7$, —S—C$_{1-10}$-alkyl, —NH$_2$, —NHR$^7$, —NR$^7$R$^8$, —NH—COR$^7$, —COOH, —COOR$^7$, —CONH$_2$, —CONHR$^7$, —CONR$^7$R$^8$, —CO—H, —COR$^7$, C$_{1-10}$-alkyl, C$_{2-10}$-alkenyl, C$_{2-10}$-alkynyl, C$_{6-14}$-aryl and monovalent 5 to 14 membered aromatic heterocyclic residue;

wherein R$^7$ and R$^8$ at each occurrence are independently from each other selected from the group consisting of C$_{1-10}$-alkyl, C$_{2-10}$-alkenyl, C$_{2-10}$-alkynyl, C$_{3-10}$-cycloalkyl, C$_{5-10}$-cycloalkenyl, monovalent 3 to 14 membered aliphatic heterocyclic residue, C$_{6-14}$-aryl and monovalent 5 to 14 membered aromatic heterocyclic residue, or L is

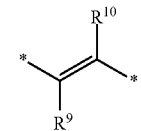

wherein

R$^9$ and R$^{10}$ are independently from each other H, C$_{1-30}$-alkyl, —CN or halogen, q and s are independently from each other 0, 1, 2, 3, 4 or 5, r is 0, 1 or 2, and n is an integer from 5 to 10,000.

In more preferred units of formula (1)

G$^1$ and G$^2$ are independently from each other monocyclic bivalent 5 to 8 membered aromatic heterocyclic residue optionally substituted with 1 to 4 substituents R$^a$, wherein R$^a$ at each occurrence are independently from each C$_{1-30}$-alkyl, preferably C$_{6-20}$-alkyl, more preferably C$_{8-16}$-alkyl, L is monocyclic bivalent 5 to 8 membered aromatic heterocyclic residue optionally substituted with 1 to 4 substituents R$^b$, wherein R$^b$ at each occurrence are independently from each other C$_{1-30}$-alkyl, q and s are both 1, r is 2, and n is an integer from 5 to 10,000.

Particular preferred units of formula (1) are units of formula

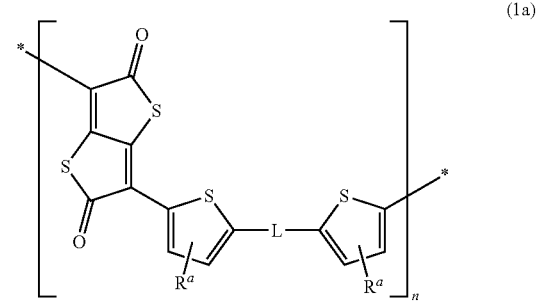

(1a)

wherein R$^a$ and L are as defined above.

In particular preferred units of formula (1a) L is

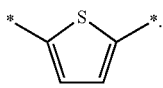

Preferably, n is an integer from 5 to 5,000, more preferably from 5 to 1,000, even more preferably from 5 to 100, and most preferably from 10 to 100.

A particular preferred example of the units of formulae (1) and (1a) is the unit of formula

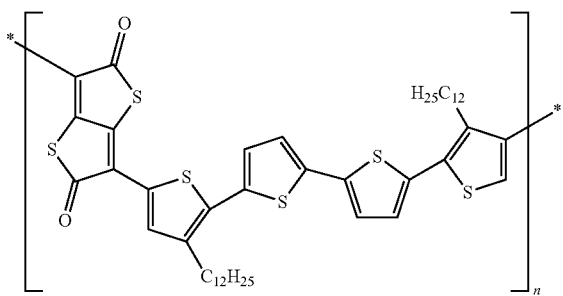

wherein n is an integer from 10 to 1000, preferably from 10 to 100.

The organic polymeric semiconducting material of the present invention can be a polymer comprising preferably at least 80% by weight, more preferably at least 90% by weight, of a unit of formula (1), respectively, (1a) based on the weight of the polymer.

Most preferably, the organic polymeric semiconducting material of the present invention is a polymer consisting essentially of a unit of formula (1), respectively, (1a).

The polymer comprising a unit of formula (1) can be prepared by treating a compound of formula

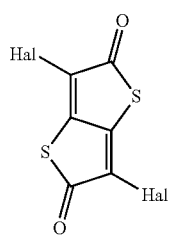 (2)

wherein Hal is halogen, preferably —Br, with a compound of formula

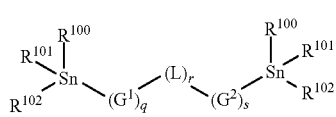 (3)

wherein $G^1$, $G^2$, L, q, r and s are as defined above, and $R^{100}$, $R^{101}$ and $R^{102}$ are independently from each other $C_{1-10}$-alkyl, preferably methyl.
in the presence of transition metal catalyst.

The transition metal catalyst is preferably a palladium catalyst such tris(dibenzylideneacetone)-dipalladium(0), preferably in combination with a phosphine such as tri-o-tolylphosphine. The reaction is preferably performed at elevated temperatures such 80 to 200° C., preferably 90 to 150° C. The reaction can be performed in an inert organic solvent such as chlorobenzene. The reaction can be stopped by the addition of end cappers such as 2-bromothiophene and 2-tributylstannylthiophene. The crude product may be worked up by conventional methods, for example compound (1) may be isolated from the reaction mixture by precipitation, for example by pouring the reaction mixture into methanol. The so obtained compound (1) may be further purified by extracting it with an appropriate solvent, for example with acetone.

The compound of formula (2) can be prepared by methods known in the art, for example as described in E. Günther, S. Hünig, Chem. Ber. 1992, 125, 1235-1241.

Also part of the present invention is an electronic device comprising the polymer comprising a unit of formula (1) as semiconducting material. Preferably, the electronic device is an organic field effect transistor (OFET), and in particular a thin film transistor (TFT). Preferably, the electronic device is an organic photovoltaic device (OPV).

Usually, an organic field effect transistor comprises a dielectric layer, a semiconducting layer and a substrate. In addition, on organic field effect transistor usually comprises a gate electrode and source/drain electrodes.

An organic field effect transistor can have various designs. The most common design of a field-effect transistor is the Bottom-Gate Top-Contact (BGTC) design. Here, the gate is on top of the substrate and at the bottom of the dielectric layer, the semiconducting layer is at the top of the dielectric layer and the source/drain electrodes are on top of the semiconducting layer.

Another design of a field-effect transistor is the Top-Gate Bottom-Contact (TGBC) design. Here, the source/drain electrodes are on top of the substrate and at the bottom of the semiconducting layer, the dielectric layer is on top of the semiconducting layer and the gate electrode is on top of the dielectric layer.

The semiconducting layer comprises the organic polymeric semiconducting material of the present invention. The semiconducting layer can have a thickness of 5 to 500 nm, preferably of 10 to 100 nm, more preferably of 20 to 50 nm.

The dielectric layer comprises a dielectric material. The dielectric material can be silicium/silicium dioxide, or, preferably, an organic polymer such as polystyrene (PS), poly(methyl-methacrylate) (PMMA), poly(4-vinylphenol) (PVP), poly(vinyl alcohol) (PVA), anzocyclobutene (BCB), or polyimide (PI). The dielectric layer can have a thickness of 10 to 2000 nm, preferably of 50 to 1000 nm, more preferably of 100 to 800 nm.

The source/drain contacts and the gate contact can be made from any suitable material, for example Au.

The substrate can be any suitable substrate such as glass, or a plastic substrate. Preferably the substrate is a plastic substrate such as polyethersulfone, polycarbonate, polysulfone, polyethylene terephthalate (PET) and polyethylene naphthalate (PEN). More preferably, the plastic substrate is a plastic foil.

The organic field effect transistor can be prepared by methods known in the art.

For example, a top-gate bottom-contact (TGBC) thin film transistors (TFTs) can be prepared as follows: first: the source/drain contacts are placed on the substrate, for example by thermal evaporation of the source/drain material; second: the substrate is coated with the semiconducting layer, for example by spin-coating a solution of the semiconducting material in a suitable solvent and drying the semiconducting layer at elevated temperatures, for example at 80 to 100° C.; third: the semiconducting layer is coated with a solution of the dielectric material in a suitable solvent, for example by spin-coating a solution of the dielectric material and drying the dielectric layer at elevated temperatures, for example at 80 to 100° C.; fourth: the gate contact is placed on top of the dielectric layer, for example by thermal evaporation of the gate material.

Also part of the present invention is the use of the polymer comprising the unit of formula (1) as semiconducting material.

Electronic devices comprising the organic polymeric semiconducting materials of the present invention show high charge carrier mobility as well as high stability, in particular towards oxidation by air, under ambient environmental conditions.

In addition, the organic polymeric semiconducting materials of the present invention are compatible with liquid processing techniques such as spin coating and thus allow the production of low cost, light weight and flexible electronic devices.

EXAMPLES

Example 1

Preparation of Compound 5

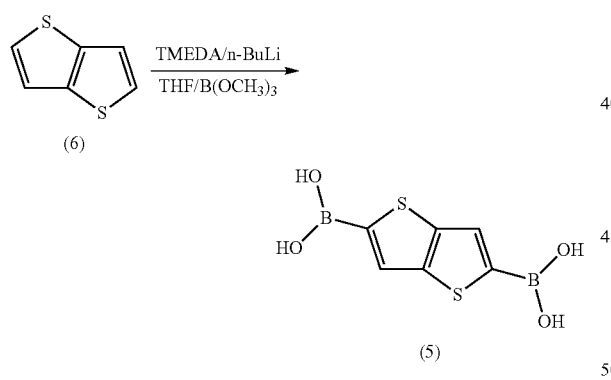

Thienothiophene (6) (5 g, 35.7 mmol) and tetramethylethylenediamine (16 mL, 107 mmol) are dissolved in THF (100 mL), degassed and charged with nitrogen. n-BuLi (56 mL, 1.6 M, 89.1 mmol) are added slowly at −78° C. The mixture is stirred for 2.5 hours, and then the mixture is allowed to warm to room temperature. The mixture is stirred at room temperature for another 0.5 hours. The mixture is cooled to −78° C., and trimethyl borate (16 mL, 143 mmol) is added. The color of the solution changes to orange red. The reaction mixture is stirred overnight and quenched with 5N aqueous HCl (20 mL). The reaction mixture is extracted with THF and diethyl ether. The organic layers are collected, washed with cold 2N aqueous NaOH (2×100 mL) and with brine, and dried over anhydrous $Na_2SO_4$. The solvent is removed, and the residue is dried under vacuum to yield compound 5.

Example 2

Preparation of Compound 4

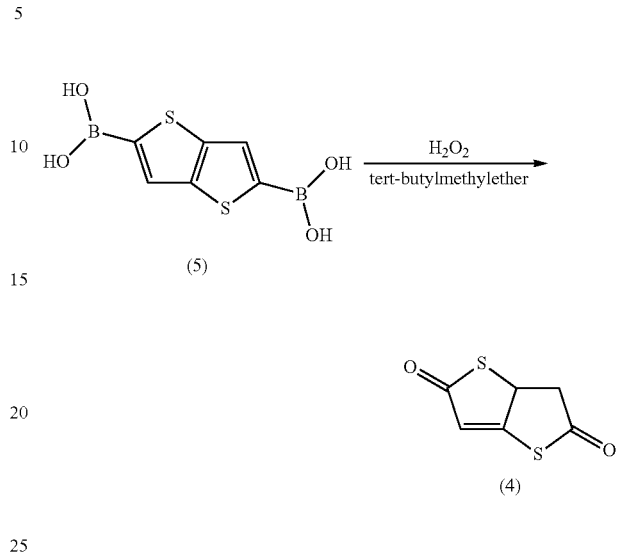

Hydrogen peroxide (20 mL) is slowly added to a dispersion of compound 5, prepared as described in example 1, in tert-butylmethyl ether (60 mL) at 0° C. The mixture is stirred overnight at room temperature. The reaction mixture is then washed twice with cold $FeSO_4$ aqueous solution. The reaction mixture is extracted with THF and diethyl ether. The organic layers are collected and dried over anhydrous $Na_2SO_4$. The solvent is removed and the residue dried under vacuum to yield compound 4 as black solid.

Example 3

Preparation of thieno[3,2-b]thiophene-2,5-dione (3)

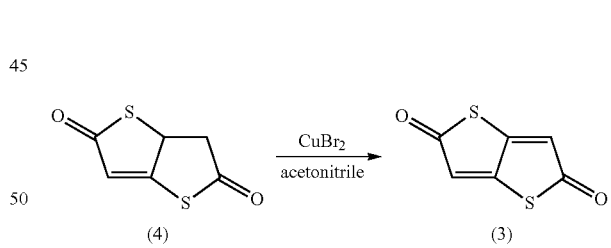

Compound 4 prepared as described in example 2 is dissolved in acetonitrile (150 mL). A solution of $CuBr_2$ (11 g, 471 mmol) in acetonitrile (80 mL) is added at 0° C. and the reaction mixture is stirred at room temperature overnight. The solvent is then removed, and the residue is redissolved in dichloromethane and filtered. The resulting solution is concentrated and dried. Crude compound 3 is purified on silica gel column chromatography using dichloromethane/n-hexane (1/1) as eluent, and recrystallized from hexane to give thieno[3,2-b]thiophene-2,5-dione (3) as green yellow crystals. $^1$H-NMR ($CDCl_3$, 400 MHz) ppm 8.09 (s, 2H). $^{13}$C-NMR ($CDCl_3$) (100 MHz) ppm 187.741, 162.399, 122.180.

Example 4

Preparation of Compound 2a

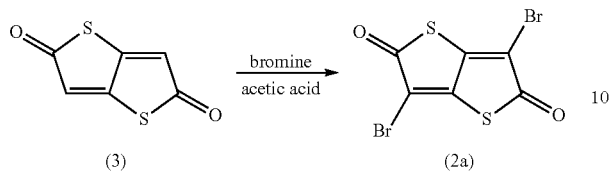

Thieno[3,2-b]thiophene-2,5-dione (3) (100 mg, 0.59 mmol) is dissolved in acetic acid (25 mL), and bromine (0.8 mL, 15 mmol) is added. The reaction mixture is stirred at 60° C. for 36 hours with the addition of bromine (0.8 mL, 15 mmol) again after 24 hours. The reaction is quenched by adding a solution of sodium thiosulfate and cooled to room temperature, any volatiles are distilled under reduced pressure. The remaining residue is dissolved in THF, filtered and flushed rapidly through a short silica gel column using THF as eluent. After the solvent is removed, crude compound 2a is recrystalized from THF/ethanol (1/10) to give compound 2a as a brown crystal (105 mg, 54%). $^{13}$C-NMR (THF) (100 MHz) ppm 181.349, 158.667, 117.855.

Example 5

Preparation of Polymer P1 Essentially Consisting of the Unit of Formula 1b

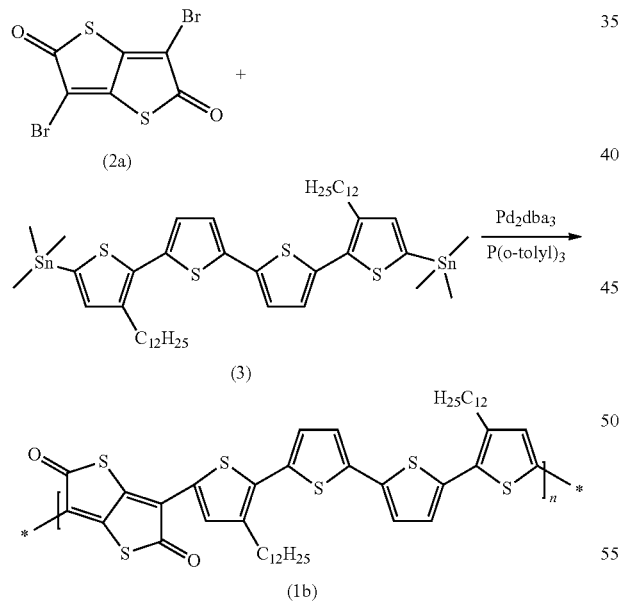

Tris(dibenzylideneacetone)dipalladium(0) (6.3 mg, 0.007 mmol) and tri(o-tolyl)phosphine (4.2 mg, 0.01 mmol) are added to a solution of compound 2a prepared as described in example 4 (75 mg, 0.23 mmol) and compound 3 (228 mg, 0.23 mmol) in anhydrous chlorobenzene (7.7 mL) under nitrogen. The resulting mixture is refluxed for 2 days under nitrogen. The mixture is cooled to room temperature, poured into methanol (300 mL) and stirred for 2 hours at room temperature. The precipitate is filtered and washed with methanol and subjected to Soxhlet extraction in acetone. The precipitate is then dissolved in toluene and precipitated with methanol to obtain polymer P1.

The invention claimed is:

1. A polymer, comprising a unit of formula (I):

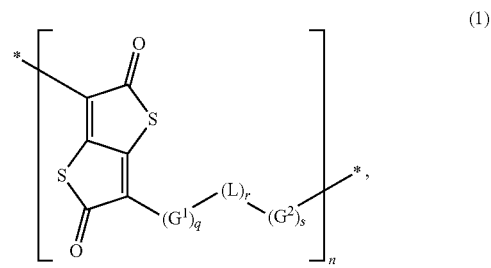

wherein:
$G^1$ and $G^2$ are independently from each other $C_{6-14}$-arylene optionally substituted with 1 to 6 substituents $R^a$ or bivalent 5 to 14 membered aromatic heterocyclic residue optionally substituted with 1 to 6 substituents $R^a$;

$R^a$ at each occurrence are independently from each other selected from the group consisting of =O, =C(CN)$_2$, —O—C$_{2-6}$-alkylene-O—, halogen, —CN, —NO$_2$, —OH, C$_{1-30}$-alkoxy, —O—CH$_2$CH$_2$O—C$_{1-30}$-alkyl, —O—COR$^1$, —S—C$_{1-30}$-alkyl, —NH$_2$, —NHR$^1$, —NR$^1$R$^2$, —NH—COR$^1$, —COOH, —COOR$^1$, —CONH$_2$, —CONHR$^1$, —CONR$^1$R$^2$, —CO—H, —COR$^1$, C$_{1-30}$-alkyl optionally substituted with 1 to 6 substituents $R^c$, C$_{2-30}$-alkenyl optionally substituted with 1 to 6 substituents $R^c$, C$_{2-30}$-alkynyl optionally substituted with 1 to 6 substituents $R^c$, C$_{3-10}$-cycloalkyl optionally substituted with 1 to 6 substituents $R^d$, C$_{5-10}$-cycloalkenyl optionally substituted with 1 to 6 substituents $R^d$ and monovalent 3 to 14 membered aliphatic heterocyclic residue optionally substituted with 1 to 6 substituents $R^d$;

$R^1$ and $R^2$ at each occurrence are independently from each other selected from the group consisting of C$_{1-30}$-alkyl, C$_{2-30}$-alkenyl, C$_{2-30}$-alkynyl, C$_{3-10}$-cycloalkyl, C$_{5-10}$-cyclo-alkenyl, monovalent 3 to 14 membered aliphatic heterocyclic residue, C$_{6-14}$-aryl and monovalent 5 to 14 membered aromatic heterocyclic residue;

$R^c$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^3$, —S—C$_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, C$_{3-10}$-cyclo-alkyl, monovalent 3 to 14 membered aliphatic heterocyclic residue, C$_{6-14}$-aryl and monovalent 5 to 14 membered aromatic heterocyclic residue;

$R^d$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^3$, —S—C$_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, C$_{1-10}$-alkyl, C$_{2-10}$-alkenyl, C$_{2-10}$-alkynyl, C$_{6-14}$-aryl and monovalent 5 to 14 membered aromatic heterocyclic residue; and $R^3$ and $R^4$ at each occurrence are independently from each other selected from the group consisting of $C_{1-10}$-alkyl, $C_{2-10}$-alkenyl, $C_{2-10}$-alkynyl, $C_{3-10}$-cycloalkyl, $C_{5-10}$-cyclo-alkenyl, monovalent 3 to 14 membered aliphatic heterocyclic residue, $C_{6-14}$-aryl and monovalent 5 to 14 membered aromatic heterocyclic residue, or wherein:

$G^1$ and $G^2$ are independently from each other:

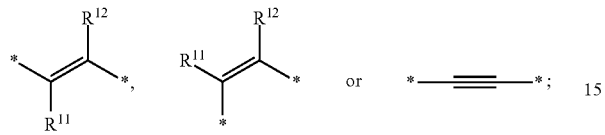

$R^{11}$ and $R^{12}$ are independently from each other H or $C_{1-30}$-alkyl;

L is $C_{6-24}$-arylene optionally substituted with 1 to 6 substituents $R^b$ or bivalent 5 to 24 membered aromatic heterocyclic residue optionally substituted with 1 to 6 substituents $R^b$;

$R^b$ at each occurrence are independently from each other selected from the group consisting of =O, =C(CN)$_2$, —O—$C_{2-6}$-alkylene-O—, halogen, —CN, —NO$_2$, —OH, $C_{1-30}$-alkoxy, —O—CH$_2$CH$_2$O—$C_{1-30}$-alkyl, —O—COR$^5$, —S—$C_{1-30}$-alkyl, —NH$_2$, —NHR$^5$, —NR$^5$R$^6$, —NH—COR$^5$, —COOH, —COOR$^5$, —CONH$_2$, —CONHR$^5$, —CONR$^5$R$^6$, —CO—H, —COR$^5$, $C_{1-30}$-alkyl optionally substituted with 1 to 6 substitutents $R^e$, $C_{2-30}$-alkenyl optionally substituted with 1 to 6 substitutents $R^e$, $C_{2-30}$-alkynyl optionally substituted with 1 to 6 substitutents $R^e$, $C_{3-10}$-cycloalkyl optionally substituted with 1 to 6 substituents $R^f$, $C_{5-10}$-cycloalkenyl optionally substituted with 1 to 6 substitutents $R^f$ and monovalent 3 to 14 membered aliphatic heterocyclic residue optionally substituted with 1 to 6 substitutents $R^f$;

$R^5$ and $R^6$ at each occurrence are independently from each other selected from the group consisting of $C_{1-30}$-alkyl, $C_{2-30}$-alkenyl, $C_{2-30}$-alkynyl, $C_{3-10}$-cycloalkyl, $C_{5-10}$-cyclo-alkenyl, monovalent 3 to 14 membered aliphatic heterocyclic residue, $C_{6-14}$-aryl and monovalent 5 to 14 membered aromatic heterocyclic residue;

$R^e$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^7$, —S—$C_{1-10}$-alkyl, —NH$_2$, —NHR$^7$, —NR$^7$R$^8$, —NH—COR$^7$, —COOH, —COOR$^7$, —CONH$_2$, —CONHR$^7$, —CONR$^7$R$^8$, —CO—H, —COR$^7$, $C_{3-10}$-cyclo-alkyl, monovalent 3 to 14 membered aliphatic heterocyclic residue, $C_{6-14}$-aryl and monovalent 5 to 14 membered aromatic heterocyclic residue;

$R^f$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^7$, —S—$C_{1-10}$-alkyl, —NH$_2$, —NHR$^7$, —NR$^7$R$^8$, —NH—COR$^7$, —COOH, —COOR$^7$, —CONH$_2$, —CONHR$^7$, —CONR$^7$R$^8$, —CO—H, —COR$^7$, $C_{1-10}$alkyl, $C_{2-10}$-alkenyl, $C_{2-10}$-alkynyl, $C_{6-14}$-aryl and monovalent 5 to 14 membered aromatic heterocyclic residue; and $R^7$ and $R^8$ at each occurrence are independently from each other selected from the group consisting of $C_{1-10}$-alkyl, $C_{2-10}$-alkenyl, $C_{2-10}$-alkynyl, $C_{3-10}$-cycloalkyl, $C_{5-10}$-cyclo-alkenyl, monovalent 3 to 14 membered aliphatic heterocyclic residue, $C_{6-14}$-aryl and monovalent 5 to 14 membered aromatic heterocyclic residue, or wherein:

L is:

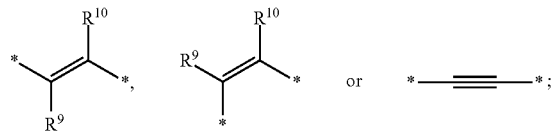

$R^9$ and $R^{10}$ are independently from each other H, $C_{1-30}$alkyl, —CN or halogen;

q and s are independently from each other 0, 1, 2, 3, 4 or 5;

r is 0, 1 or 2; and n is an integer from 2 to 10'000.

2. The polymer of claim 1, wherein, in the unit of formula (1):

$G^1$ and $G^2$ are independently from each other bivalent 5 to 14 membered aromatic heterocyclic residue optionally substituted with 1 to 6 substituents $R^a$;

$R^a$ at each occurrence are independently from each other selected from the group consisting of =O, =C(CN)$_2$, —O—$C_{2-6}$-alkylene-O—, halogen, —CN, —NO$_2$, —OH, $C_{1-30}$-alkoxy, —O—CH$_2$CH$_2$O—$C_{1-30}$-alkyl, —O—COR$^1$, —S—$C_{1-30}$-alkyl, —NH$_2$, —NHR$^1$, —NR$^1$R$^2$, —NH—COR$^1$, —COOH, —COOR$^1$, —CONH$_2$, —CONHR$^1$, —CONR$^1$R$^2$, —CO—H, —COR$^1$, $C_{1-30}$-alkyl optionally substituted with 1 to 6 substituents $R^c$, $C_{2-30}$-alkenyl optionally substituted with 1 to 6 substituents $R^c$, $C_{2-30}$-alkynyl optionally substituted with 1 to 6 substituents $R^c$, $C_{3-10}$-cycloalkyl optionally substituted with 1 to 6 substituents $R^d$, $C_{5-10}$-cycloalkenyl optionally substituted with 1 to 6 substituents $R^d$ and monovalent 3 to 14 membered aliphatic heterocyclic residue optionally substituted with 1 to 6 substituents $R^d$;

$R^1$ and $R^2$ at each occurrence are independently from each other selected from the group consisting of $C_{1-30}$-alkyl, $C_{2-30}$-alkenyl, $C_{2-30}$-alkynyl, $C_{3-10}$-cycloalkyl, $C_{5-10}$-cyclo-alkenyl, monovalent 3 to 14 membered aliphatic heterocyclic residue, $C_{6-14}$-aryl and monovalent 5 to 14 membered aromatic heterocyclic residue;

$R^c$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^3$, —S—$C_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, $C_{3-10}$-cyclo-alkyl, monovalent 3 to 14 membered aliphatic heterocyclic residue, $C_{6-14}$-aryl and monovalent 5 to 14 membered aromatic heterocyclic residue;

$R^d$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^3$, —S—$C_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, C$_{1-10}$-alkyl, C$_{2-10}$-alkenyl, C$_{2-10}$-alkynyl, C$_{6-14}$-aryl and monovalent 5 to 14 membered aromatic heterocyclic residue; and R$^3$ and R$^4$ at each occurrence are independently from each other selected from the group consisting of C$_{1-10}$-alkyl, C$_{2-10}$-alkenyl, C$_{2-10}$-alkynyl, C$_{3-10}$-cycloalkyl, C$_{5-10}$-cyclo-alkenyl, monovalent 3 to 14 membered aliphatic heterocyclic residue, C$_{6-14}$-aryl and monovalent 5 to 14 membered aromatic heterocyclic residue.

3. The polymer of claim 1, wherein, in the unit of formula (1):
G$^1$ and G$^2$ are independently from each other monocyclic bivalent 5 to 8 membered aromatic heterocyclic residue optionally substituted with 1 to 4 substituents R$^a$;
R$^a$ at each occurrence are independently from each other C$_{1-30}$-alkyl.

4. The polymer of any one of claims 1 to 3, wherein, in the unit of formula (1):
L is bivalent 5 to 24 membered aromatic heterocyclic residue optionally substituted with 1 to 6 substituents R$^b$;
R$^b$ at each occurrence are independently from each other selected from the group consisting of =O, =C(CN)$_2$, —O—C$_{2-6}$-alkylene-O—, halogen, —CN, —NO$_2$, —OH, C$_{1-30}$-alkoxy, —O—CH$_2$CH$_2$O—C$_{1-30}$-alkyl, —O—COR$^5$, —S—C$_{1-30}$-alkyl, —NH$_2$, —NHR$^5$, —NR$^5$R$^6$, —NH—COR$^5$, —COOH, —COOR$^5$, —CONH$_2$, —CONHR$^5$, —CONR$^5$R$^6$, —CO—H, —COR$^5$, C$_{1-30}$-alkyl optionally substituted with 1 to 6 substituents R$^e$, C$_{2-30}$-alkenyl optionally substituted with 1 to 6 substituents R$^e$, C$_{2-30}$-alkynyl optionally substituted with 1 to 6 substituents R$^e$, C$_{3-10}$-cycloalkyl optionally substituted with 1 to 6 substituents R$^f$, C$_{5-10}$-cycloalkenyl optionally substituted with 1 to 6 substituents R$^f$ and monovalent 3 to 14 membered aliphatic heterocyclic residue optionally substituted with 1 to 6 substituents R$^f$;
R$^5$ and R$^6$ at each occurrence are independently from each other selected from the group consisting of C$_{1-30}$-alkyl, C$_{2-30}$-alkenyl, C$_{2-30}$-alkynyl, C$_{3-10}$-cycloalkyl, C$_{5-10}$-cyclo-alkenyl, monovalent 3 to 14 membered aliphatic heterocyclic residue, C$_{6-14}$-aryl and monovalent 5 to 14 membered aromatic heterocyclic residue;
R$^e$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^7$, —S—C$_{1-10}$-alkyl, —NH$_2$, —NHR$^7$, —NR$^7$R$^8$, —NH—COR$^7$, —COOH, —COOR$^7$, —CONH$_2$, —CONHR$^7$, —CONR$^7$R$^8$, —CO—H, —COR$^7$, C$_{3-10}$-cyclo-alkyl, monovalent 3 to 14 membered aliphatic heterocyclic residue, C$_{6-14}$-aryl and monovalent 5 to 14 membered aromatic heterocyclic residue;
R$^f$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^7$, —S—C$_{1-10}$-alkyl, —NH$_2$, —NHR$^7$, —NR$^7$R$^8$, —NH—COR$^7$, —COOH, —COOR$^7$, —CONH$_2$, —CONHR$^7$, —CONR$^7$R$^8$, —CO—H, —COR$^7$, C$_{1-10}$-alkyl, C$_{2-10}$-alkenyl, C$_{2-10}$-alkynyl, C$_{6-14}$-aryl and monovalent 5 to 14 membered aromatic heterocyclic residue; and
R$^7$ and R$^8$ at each occurrence are independently from each other selected from the group consisting of C$_{1-10}$-alkyl, C$_{2-10}$-alkenyl, C$_{2-10}$-alkynyl, C$_{3-10}$-cycloalkyl, C$_{5-10}$-cyclo-alkenyl, monovalent 3 to 14 membered aliphatic heterocyclic residue, C$_{6-14}$-aryl and monovalent 5 to 14 membered aromatic heterocyclic residue,
or
wherein:
L is:

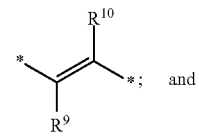

R$^9$ and R$^{10}$ are independently from each other H, C$_{1-30}$-alkyl, CN or halogen.

5. The polymer of any one of claims 1 to 3, wherein in the unit of formula (1):
L is monocyclic bivalent 5 to 8 membered aromatic heterocyclic residue optionally substituted with 1 to 4 substituents R$^b$; and
R$^b$ at each occurrence are independently from each other C$_{1-30}$-alkyl.

6. The polymer of any one of claims 1 to 3, wherein:
q and s are both 1;
r is 2; and
n is an integer from 5 to 10'000.

7. The polymer of claim 1, wherein the unit of formula (1) is a unit of formula (1a):

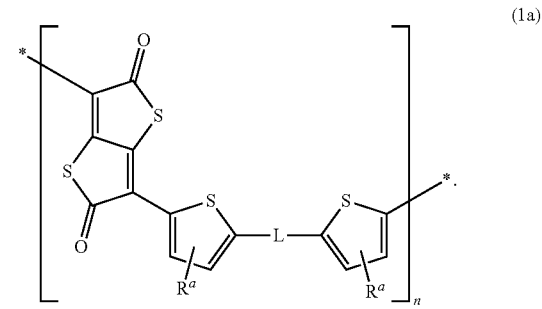

(1a)

8. The polymer of claim 7, wherein L is:

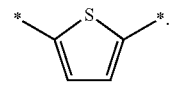

9. The polymer of claim 7 or claim 8, wherein R$^a$ is at each occurrence are independently from each other C$_{1-30}$-alkyl.

10. The polymer of any one of claims 1 to 3 or 7 to 8, wherein n is an integer from 5 to 5'000.

11. An electronic device, comprising the polymer of any one of claims 1 to 3 or 7 to 8 as semiconducting material.

12. The electronic device of claim 11, which is an organic field effect transistor (OFET).

13. The electronic device of claim 11, which is an organic photovoltaic device (OPV).

14. A semiconducting material, comprising the polymer of any one of claims 1 to 3 or 7 to 8.

* * * * *